(12) United States Patent  (10) Patent No.: US 7,505,239 B2
Kanazawa et al.  (45) Date of Patent: *Mar. 17, 2009

(54) LIGHT EMITTING DEVICE

(75) Inventors: Jitsuo Kanazawa, Tokyo (JP); Nobuei Shimojo, Tokyo (JP); Dai Matsuoka, Nikaho (JP); Kimio Suto, Nikaho (JP); Makoto Numata, Yurihonjo (JP); Yo Saito, Yurihonjo (JP)

(73) Assignee: TDK Corporation, Tokyo (JP)

( * ) Notice: Subject to any disclaimer, the term of this patent is extended or adjusted under 35 U.S.C. 154(b) by 376 days.

This patent is subject to a terminal disclaimer.

(21) Appl. No.: 11/402,869

(22) Filed: Apr. 13, 2006

(65) Prior Publication Data

US 2006/0232373 A1 Oct. 19, 2006

(30) Foreign Application Priority Data

Apr. 14, 2005 (JP) ............................ P2005-117425
Apr. 19, 2005 (JP) ............................ P2005-121347

(51) Int. Cl.
*H02H 9/00* (2006.01)

(52) U.S. Cl. ......................................... 361/56; 361/118
(58) Field of Classification Search ................. 361/118, 361/56

See application file for complete search history.

(56) References Cited

U.S. PATENT DOCUMENTS 4,320,379 A 3/1982 Yodogawa
6,232,867 B1 5/2001 Yoshida et al.
7,279,724 B2 * 10/2007 Collins et al. ............... 257/103
7,355,251 B2 * 4/2008 Kanazawa et al. .......... 257/355

FOREIGN PATENT DOCUMENTS

| JP | A-52-62681 | 5/1977 |
| JP | A-56-140602 | 11/1981 |
| JP | A-2-256216 | 10/1990 |
| JP | A-5-55084 | 3/1993 |
| JP | A-11-67583 | 3/1999 |
| JP | A-2000-277306 | 10/2000 |
| JP | A 2001-15815 | 1/2001 |
| JP | A-2001-307910 | 11/2001 |
| JP | A-2002-57066 | 2/2002 |
| JP | A-2004-26562 | 1/2004 |
| JP | A-2004-31436 | 1/2004 |
| WO | WO 2004/043116 A1 | 5/2004 |

* cited by examiner

*Primary Examiner*—Stephen W Jackson
(74) *Attorney, Agent, or Firm*—Oliff & Berridge, PLC

(57) ABSTRACT

A light emitting device has a semiconductor light emitting element and a multilayer chip varistor. The multilayer chip varistor has a multilayer body with a varistor portion therein, and a plurality of external electrodes disposed on an outer surface of the multilayer body. The varistor portion has a varistor layer containing ZnO as a principal component and exhibiting nonlinear voltage-current characteristics, and a plurality of internal electrodes arranged to interpose the varistor layer between them. Each of the external electrodes is connected to a corresponding internal electrode out of the plurality of internal electrodes. The semiconductor light emitting element is disposed on the multilayer chip varistor. The semiconductor light emitting element is connected to corresponding external electrodes out of the plurality of external electrodes so as to be connected in parallel to the varistor portion.

21 Claims, 17 Drawing Sheets

LIGHT EMITTING DEVICE

BACKGROUND OF THE INVENTION

1. Field of the Invention

The present invention relates to a light emitting device.

2. Related Background Art

One of the known light emitting devices of this type is a light emitting device comprising a semiconductor light emitting element, and a varistor connected in parallel to the semiconductor light emitting element (e.g., reference is made to Japanese Patent Application Laid-Open No. 2001-15815). In the light emitting device described in the Laid-Open No. 2001-15815, the semiconductor light emitting element is protected from ESD (Electrostatic Discharge) surge by the varistor connected in parallel thereto.

SUMMARY OF THE INVENTION

Incidentally, the semiconductor light emitting element generates heat during its light emission operation. As the semiconductor light emitting element increases its temperature, the heat generated will affect the light emission operation. For this reason, it is necessary to efficiently diffuse the generated heat. Particularly, in a case where the semiconductor light emitting element is sealed in an optically transparent resin, it is more difficult to diffuse the heat generated by the semiconductor light emitting element.

An object of the present invention is to provide a light emitting device capable of efficiently diffusing the heat generated in the semiconductor light emitting element.

A light emitting device according to the present invention is a light emitting device comprising a semiconductor light emitting element, and a multilayer chip varistor, wherein the multilayer chip varistor has: a multilayer body with a varistor portion therein, the varistor portion comprising a varistor layer comprising ZnO as a principal component and exhibiting nonlinear voltage-current characteristics, and a plurality of internal electrodes disposed so as to interpose the varistor layer between the internal electrodes; and a plurality of external electrodes disposed on an outer surface of the multilayer body and connected to respective corresponding internal electrodes out of the plurality of internal electrodes, and wherein the semiconductor light emitting element is arranged on the multilayer chip varistor and connected to corresponding external electrodes out of the plurality of external electrodes so as to be connected in parallel to the varistor portion.

In the light emitting device according to the present invention, the multilayer chip varistor is connected in parallel to the semiconductor light emitting element, so that the semiconductor light emitting element can be protected from the ESD surge.

In the present invention, the multilayer chip varistor has the external electrodes connected to the semiconductor light emitting element, and the internal electrodes connected to the external electrodes. This causes the heat generated in the semiconductor light emitting element to be transferred mainly to the external electrodes and the internal electrodes and then to radiate. The heat radiation path is expanded for the heat generated in the semiconductor light emitting element, so that the heat generated in the semiconductor light emitting element can be efficiently diffused. Incidentally, the varistor layer comprises ZnO as a principal component. ZnO has a thermal conductivity approximately equal to that of alumina or the like normally used as a heat radiation substrate, and thus has the thermal conductivity relatively good. Therefore, it is feasible to prevent the varistor layer from inhibiting the diffusion of heat from the internal electrodes.

Preferably, the semiconductor light emitting element is arranged to face a surface extending in a direction parallel to a laminate direction of the multilayer body in the multilayer chip varistor. In this case, the plurality of internal electrodes are juxtaposed along a direction in which a surface facing the surface where the semiconductor light emitting element is disposed, in the multilayer chip varistor, extends. This decreases, for each internal electrode, the heat radiation path from the internal electrode to the outer surface of the multilayer chip varistor. In consequence, it is feasible to effect more efficient diffusion of heat from the internal electrodes.

Preferably, the plurality of external electrodes include a pair of terminal electrodes, and each of the pair of terminal electrodes comprises: a first electrode portion disposed on one outer surface extending in a direction parallel to a laminate direction of the multilayer body and selected from a pair of outer surfaces facing each other; and a second electrode portion disposed on one outer surface being adjacent to the pair of outer surfaces and extending in the direction parallel to the laminate direction of the multilayer body. In this case, the semiconductor light emitting element is connected to the second electrode portions to be mounted on the multilayer chip varistor. Therefore, it is feasible to implement easy and simple mounting for electrically connecting the semiconductor light emitting element to the external electrodes.

Preferably, the varistor layer comprises Pr, and each of the plurality of external electrodes has an electrode layer which is formed on the outer surface of the multilayer body by simultaneous firing with the multilayer body and which comprises Pd. In this case, the simultaneous firing of the electrode layer with the varistor element body results in forming an oxide of Pr and PD, e.g., $Pr_2Pd_2O_5$ or $Pr_4PdO_7$ or the like, near an interface between the multilayer body and each external electrode, and the oxide exists in the neighborhood of the interface. As a result, bonding strength can be improved between the multilayer body and the external electrodes.

The Inventors conducted elaborate research on varistors capable of achieving an improvement in the bonding strength between the varistor element body consisting primarily of ZnO, and the external electrodes. As a result, we found the new fact that the bonding strength between the multilayer body and the external electrodes varies according to materials in the multilayer body (a green body to become the multilayer body after fired) and the external electrodes (an electroconductive paste to become the external electrodes after fired).

The electroconductive paste is applied onto the outer surface of the green body consisting primarily of ZnO, and they are fired to obtain the multilayer body and the external electrodes. At this time, the bonding strength between the varistor element body and external electrodes obtained is improved if the green body contains Pr (praseodymium) and if the electroconductive paste contains Pd (palladium).

The effect of the improvement in the bonding strength between the multilayer body and the external electrodes is considered to arise from the following phenomenon during the firing. During the firing of the green body and the electroconductive paste, Pr in the green body migrates to near the surface of the green body, i.e., to near the interface between the green body and the electroconductive paste. Then Pr coming to near the interface between the green body and the electroconductive paste, and Pd in the electroconductive paste counter-diffuse. At this time, an oxide of Pr and Pd can be formed near the interfaces between the multilayer body and the external electrodes. This oxide of Pr and Pd offers an anchor effect to improve the bonding strength between the multilayer body and external electrodes obtained by the firing.

Preferably, the varistor layer comprises Pr, each of the plurality of external electrodes has an electrode layer disposed on the outer surface of the multilayer body and comprising Pd, and an oxide of Pr in the varistor layer and Pd in the electrode layer exists near an interface between the multilayer body and the electrode layer. In this case, the oxide of Pr in the multilayer body and Pd in the electrode layer exists in the neighborhood of the interfaces between the multilayer body and the external electrodes, so that the bonding strength can be improved between the multilayer body and the external electrodes.

Preferably, the electrode layer is formed on the outer surface of the multilayer body by simultaneous firing with the multilayer body. In this case, the oxide of Pr in the varistor layer and Pd in the electrode layer can be securely made to exist in the neighborhood of the interfaces between the multilayer body and the external electrodes.

Preferably, the plurality of external electrodes comprise: a pair of first external electrodes disposed on a first outer surface of the multilayer body; and a pair of second external electrodes disposed on a second outer surface of the multilayer body facing the first outer surface, the plurality of internal electrodes comprise: first electrode portions overlapping with each other between adjacent internal electrodes out of the plurality of internal electrodes; and second electrode portions led from the first electrode portions so as to be exposed in the first outer surface and in the second outer surface, and each of the pair of first external electrodes and the pair of second external electrodes is electrically connected through the second electrode portion to the corresponding internal electrode out of the plurality of internal electrodes. In this case, the semiconductor light emitting element is connected to the second external electrodes to be mounted on the multilayer chip varistor. Therefore, it is feasible to implement easy and simple mounting for electrically connecting the semiconductor light emitting element to the second external electrodes. Furthermore, the multilayer chip varistor is mounted on an external substrate, an external device, or the like in a state in which the first outer surface faces the external substrate, the external device, or the like. Therefore, it is also feasible to implement easy and simple mounting of the multilayer chip varistor.

Preferably, the first outer surface and the second outer surface extend in a direction parallel to a laminate direction of the multilayer body. In this case, the plurality of internal electrodes are juxtaposed along the direction in which the first outer surface and the second outer surface extend. This decreases, for each internal electrode, the heat radiation path from the internal electrode to the outer surface of the multilayer chip varistor. As a result, it is feasible to effect more efficient diffusion of heat from the internal electrodes.

Preferably, the semiconductor light emitting element is disposed on the multilayer chip varistor by being bump-connected to the pair of second external electrodes. In this case, it is feasible to implement extremely easy and simple mounting of the semiconductor light emitting element onto the multilayer chip varistor.

Preferably, the semiconductor light emitting element has a semiconductor region of a first conductivity type and a semiconductor region of a second conductivity type, and emits light according to a voltage applied between the semiconductor region of the first conductivity type and the semiconductor region of the second conductivity type.

Preferably, the light emitting device comprises a plurality of semiconductor light emitting elements; the multilayer body comprises a plurality of varistor portions arranged along a predetermined direction; the plurality of external electrodes comprise: a plurality of first external electrodes disposed on a first outer surface of the multilayer body; and a plurality of second external electrodes disposed on a second outer surface of the multilayer body facing the first outer surface; the first outer surface extends in a direction parallel to the predetermined direction; the plurality of internal electrodes which the plurality of varistor portions have, comprise: first electrode portions overlapping with each other between adjacent internal electrodes out of the plurality of internal electrodes; and second electrode portions led from the first electrode portions so as to be exposed in the first and second outer surfaces; each of the plurality of first external electrodes and the plurality of second external electrodes is electrically connected through the second electrode portion to the first electrode portion of a corresponding internal electrode out of the plurality of internal electrodes; the plurality of semiconductor light emitting elements are arranged on the multilayer chip varistor and each of the semiconductor light emitting elements is connected to the corresponding second external electrodes out of the plurality of second external electrodes so as to be connected in parallel to the corresponding varistor portion out of the plurality of varistor portions. In this case, each varistor portion is connected in parallel to a corresponding semiconductor light emitting element out of the plurality of semiconductor light emitting elements, whereby each semiconductor light emitting element can be protected from the ESD surge.

The plurality of varistor portions are arranged in the multilayer body, and the plurality of first external electrodes are disposed on the first outer surface. Each of the first external electrodes is electrically connected through the second electrode portion to the corresponding internal electrode. Therefore, when the light emitting device is mounted in a state in which the first outer surface faces a mounting surface of an external substrate, an external device, or the like, the plurality of varistor portions are mounted on the external substrate, the external device, or the like. This results in decreasing the mounting area in mounting the plurality of varistor portions. In addition, it is feasible to readily mount the device, while reducing mounting cost for mounting the plurality of varistor portions.

The plurality of second external electrodes are disposed on the second outer surface. Each of the second external electrodes is electrically connected through the second electrode portion to the corresponding internal electrode. This permits the plurality of semiconductor light emitting elements to be readily mounted so as to be connected in parallel to the varistor portions, by making use of the second outer surface.

Since the multilayer chip varistor has the second external electrodes connected to the semiconductor light emitting elements and the internal electrodes connected to the second external electrodes, the heat generated in the semiconductor light emitting elements is transferred mainly to the second external electrodes and internal electrodes to radiate. This expands the heat radiation paths of the heat generated in the semiconductor light emitting elements and makes it feasible to efficiently diffuse the heat generated in the semiconductor light emitting elements.

Preferably, the first outer surface and the second outer surface extend in a direction parallel to a laminate direction of the multilayer body. In this case, the plurality of internal electrodes are juxtaposed along the direction in which the first outer surface and the second outer surface extend. This decreases, for each internal electrode, the heat radiation path from the internal electrode to the outer surface of the multilayer chip varistor and makes it feasible to implement more efficient diffusion of heat from the internal electrodes.

Preferably, the varistor layer comprises Pr, each of the plurality of first external electrodes has an electrode layer formed on the first outer surface by simultaneous firing with the multilayer body, and comprising Pd, and each of the plurality of second external electrodes has an electrode layer formed on the second outer surface by simultaneous firing with the multilayer body, and comprising Pd. In this case, as described above, it is feasible to achieve an improvement in the bonding strength between the multilayer body and each external electrode.

Preferably, the varistor layer comprises Pr, each of the plurality of first external electrodes has an electrode layer disposed on the first outer surface and comprising Pd, each of the plurality of second external electrodes has an electrode layer disposed on the second outer surface and comprising Pd, and an oxide of Pr in the varistor layer and Pd in each electrode layer exists near an interface between the multilayer body and the electrode layer. In this case, as described above, it is feasible to achieve an improvement in the bonding strength between the multilayer body and the first and second external electrodes.

Preferably, the electrode layers are formed on the first and second outer surfaces by simultaneous firing with the multilayer body. In this case, the oxide can be securely made to exist in the neighborhood of the interfaces between the multilayer body and the first and second external electrodes.

Preferably, the multilayer body is of an approximate plate shape having the first outer surface and the second outer surface as principal surfaces, and a distance between the first outer surface and the second outer surface is smaller than a length of the multilayer body in the predetermined direction. In this case, the multilayer chip varistor can be constructed in a low profile, and the light emitting device can also be constructed in a low profile.

Preferably, the predetermined direction is a laminate direction of the varistor layers.

Preferably, the predetermined direction is a direction parallel to the varistor layers.

Preferably, the plurality of first external electrodes are two-dimensionally arrayed on the first outer surface, and the plurality of second external electrodes are two-dimensionally arrayed on the second outer surface.

Preferably, each semiconductor light emitting element is arranged on the multilayer chip varistor by being bump-connected to the corresponding second external electrodes. In this case, it is feasible to implement extremely easy and simple mounting of each semiconductor light emitting element onto the multilayer chip varistor.

Another light emitting device according to the present invention is a light emitting device comprising a plurality of semiconductor light emitting elements, and a multilayer chip varistor, wherein the multilayer chip varistor has a multilayer body in which a plurality of varistor portions are arranged along a predetermined direction, each of the varistor portions having a varistor layer comprising ZnO as a principal component and exhibiting nonlinear voltage-current characteristics, and a plurality of internal electrodes arranged so as to interpose the varistor layer between the internal electrodes, and wherein the plurality of semiconductor light emitting elements are arranged on the multilayer chip varistor and each of the semiconductor light emitting elements is connected in parallel to a corresponding varistor portion out of the plurality of varistor portions.

In the light emitting device according to the present invention, each varistor portion is connected in parallel to the corresponding semiconductor light emitting element out of the plurality of semiconductor light emitting elements, whereby each semiconductor light emitting element can be protected from the ESD surge. Since the multilayer body comprises the plurality of varistor portions, the mounting area can be reduced on the occasion of mounting the plurality of varistor portions. It is also feasible to achieve easy mounting, while reducing the mounting cost for mounting the plurality of varistor portions.

In the present invention the heat generated in the semiconductor light emitting elements is diffused mainly from the internal electrodes, and thus the heat radiation paths are expanded for the heat generated in the semiconductor light emitting elements. In consequence, the heat generated in the semiconductor light emitting elements can be efficiently diffused. Since the varistor layer comprises ZnO as a principal component, it is feasible to prevent the varistor layer from inhibiting the diffusion of heat from the internal electrodes, as described above.

Still another light emitting device according to the present invention is a light emitting device comprising a plurality of semiconductor light emitting elements, and a multilayer chip varistor, wherein the multilayer chip varistor comprises: a multilayer body in which a plurality of varistor layers comprising ZnO as a principal component and exhibiting nonlinear voltage-current characteristics are laminated; a plurality of first external electrodes disposed on a first outer surface of the multilayer body; and a plurality of second external electrodes disposed on a second outer surface of the multilayer body facing the first outer surface, wherein the first outer surface extends in a direction parallel to a laminate direction of the plurality of varistor layers, wherein in the multilayer body a plurality of varistor portions, each varistor portion comprising the varistor layer and a plurality of internal electrodes arranged to interpose the varistor layer between the internal electrodes, are arranged along a direction parallel to the first outer surface, wherein the plurality of internal electrodes comprise: first electrode portions overlapping with each other between adjacent internal electrodes out of the plurality of internal electrodes; and second electrode portions led from the first electrode portions so as to be exposed in the first and second outer surfaces, wherein each of the plurality of first external electrodes and the plurality of second external electrodes is electrically connected through the second electrode portion to the first electrode portion of a corresponding internal electrode out of the plurality of internal electrodes, and wherein the plurality of semiconductor light emitting elements are arranged on the multilayer chip varistor, and each of the semiconductor light emitting elements is connected to corresponding second external electrodes out of the plurality of second external electrodes so as to be connected in parallel to a corresponding varistor portion out of the plurality of varistor portions.

In the light emitting device according to the present invention, each varistor portion is connected in parallel to the corresponding semiconductor light emitting element out of the plurality of semiconductor light emitting elements, whereby each semiconductor light emitting element can be protected from the ESD surge.

In the present invention, the multilayer chip varistor (light emitting device) is mounted in a state in which the first outer surface faces a mounting surface of an external substrate, an external device, or the like, whereby the plurality of varistor portions are mounted on the external substrate, the external device, or the like. In consequence, the mounting area can be reduced on the occasion of mounting the plurality of varistor portions. It is also feasible to implement easy mounting, while reducing the mounting cost for mounting the plurality of varistor portions.

In the present invention, the plurality of second external electrodes are disposed on the second outer surface. Each of the second external electrodes is electrically connected through the second electrode portion to the corresponding internal electrode. This permits the plurality of semiconductor light emitting elements to be readily mounted so as to be connected in parallel to the varistor portions, by making use of the second outer surface.

In the present invention, the multilayer chip varistor has the second external electrodes connected to the semiconductor light emitting elements and the internal electrodes connected to the second external electrodes. This causes the heat generated in the semiconductor light emitting elements to be transferred mainly to the second external electrodes and internal electrodes and then to radiate. The heat radiation paths are expanded for the heat generated in the semiconductor light emitting elements, and the heat generated in the semiconductor light emitting elements can be efficiently diffused.

The present invention successfully provides the light emitting devices capable of efficiently diffusing the heat generated in the semiconductor light emitting element(s).

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the present invention will be described below in detail with reference to the accompanying drawings. In the description identical elements or elements with identical functionality will be denoted by the same reference symbols, without redundant description.

First Embodiment

Figure 1:
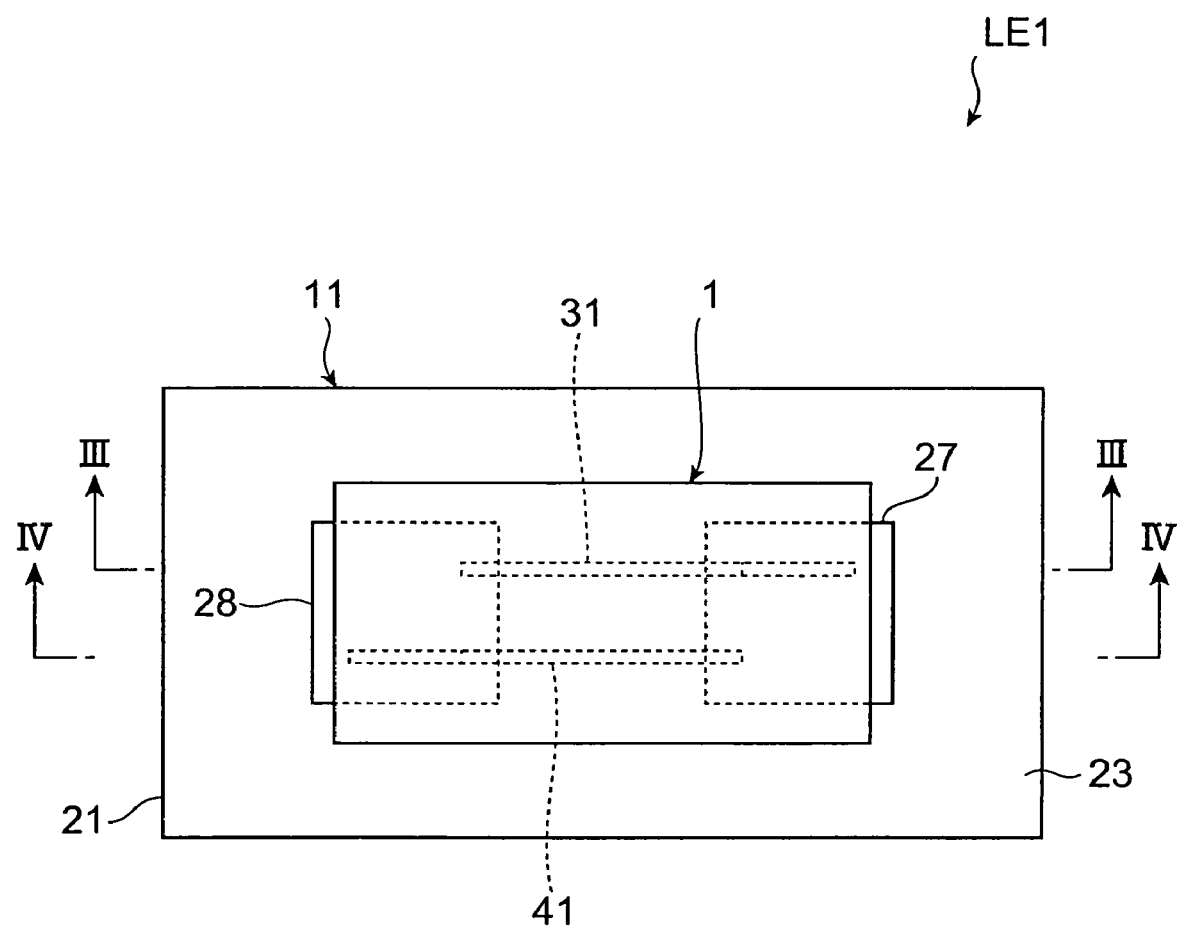
FIG. 1 is a schematic top view showing a light emitting device according to the first embodiment.
Figure 2:
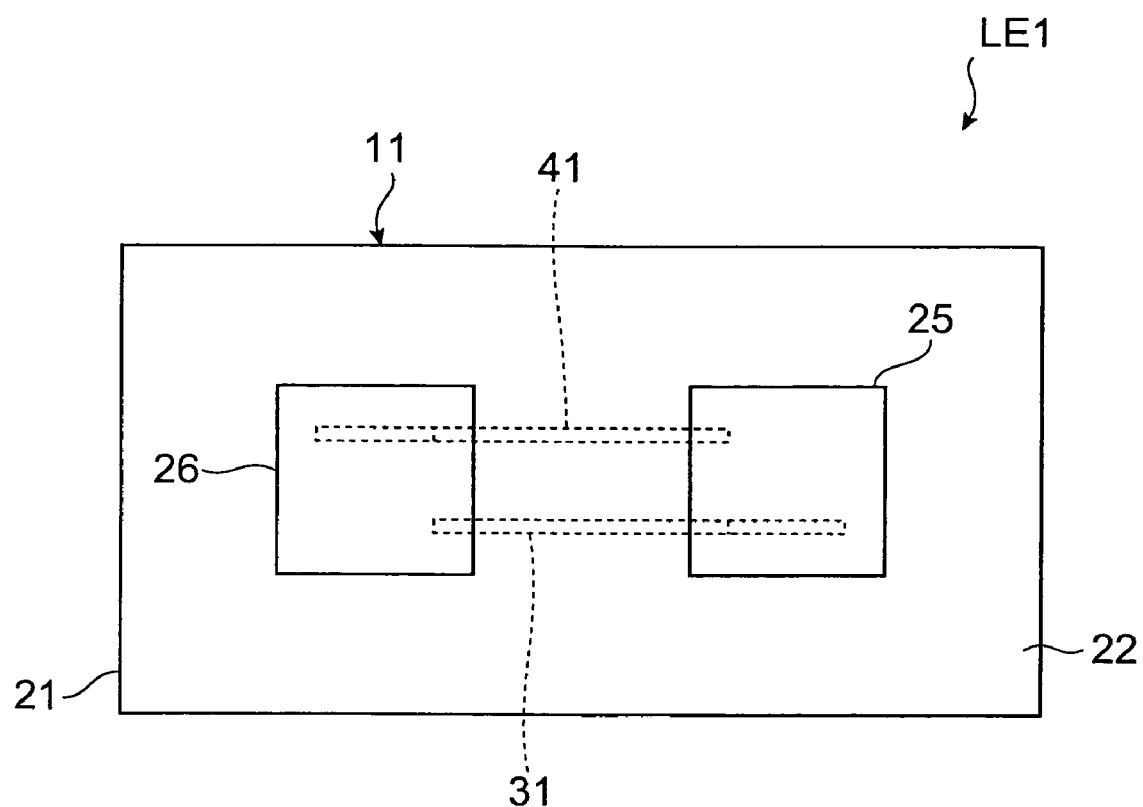
FIG. 2 is a schematic bottom view showing the light emitting device according to the first embodiment.
Figure 3:
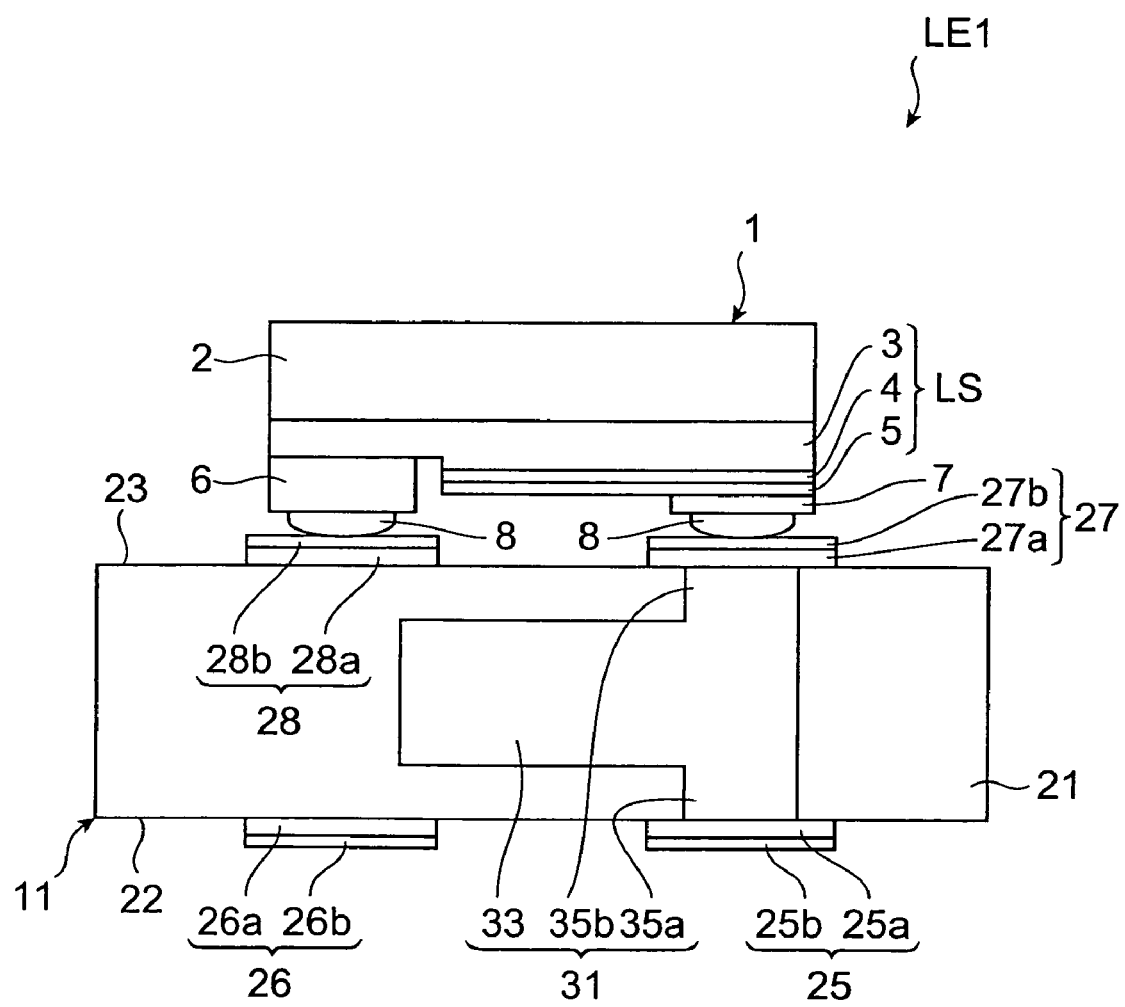
FIG. 3 is a view for explaining a sectional configuration along line III-III in FIG. 1.
Figure 4:
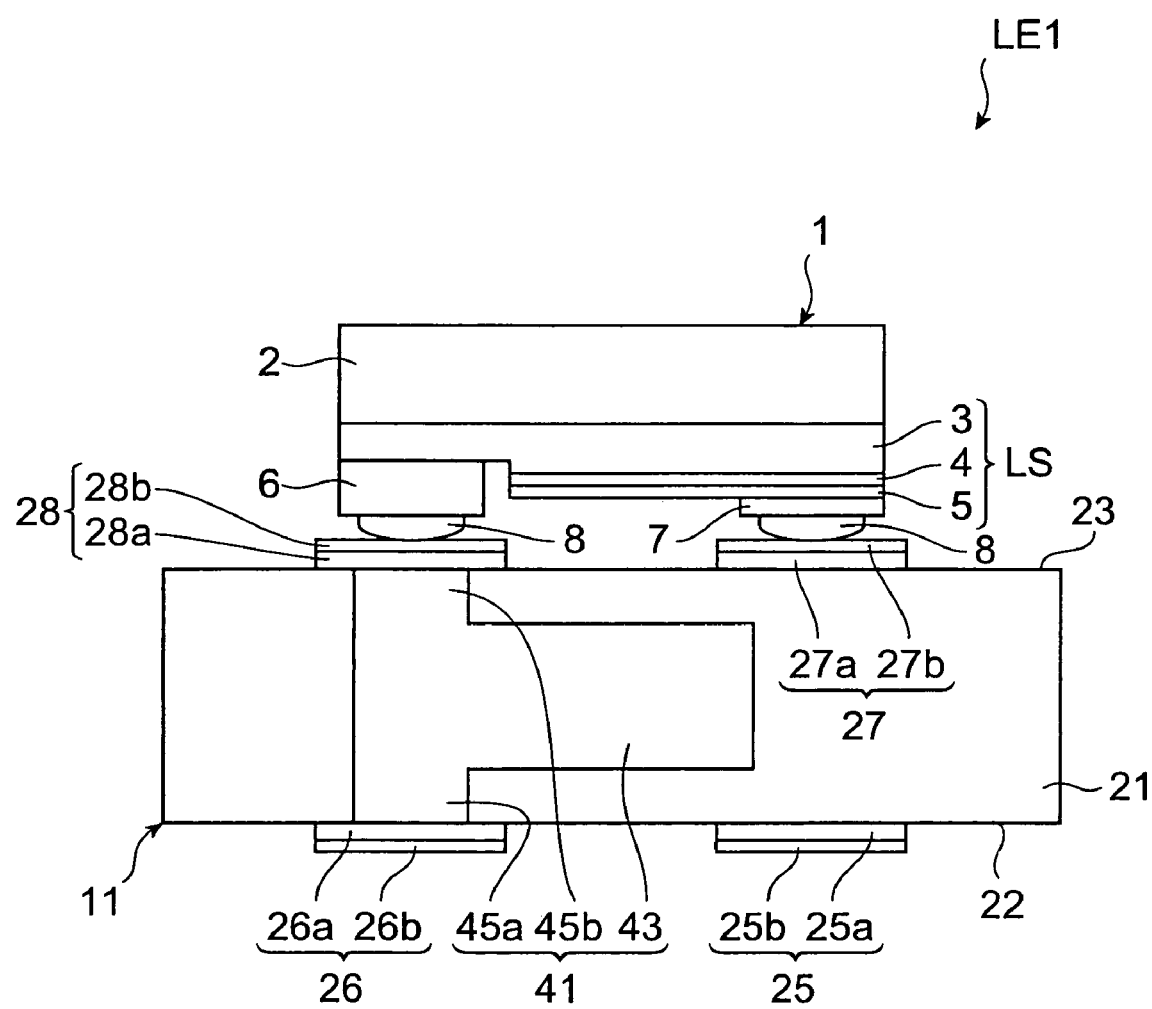
FIG. 4 is a view for explaining a sectional configuration along line IV-IV in FIG. 1.

A configuration of light emitting device LE1 according to the first embodiment will be described with reference to FIGS. 1 to 4. FIG. 1 is a schematic top view showing the light emitting device of the first embodiment. FIG. 2 is a schematic bottom view showing the light emitting device of the first embodiment. FIG. 3 is a view for explaining a sectional configuration along line III-III in FIG. 1. FIG. 4 is a view for explaining a sectional configuration along line IV-IV in FIG. 1.

The light emitting device LE1, as shown in FIGS. 1 to 4, comprises a semiconductor light emitting element 1 and a multilayer chip varistor 11. The semiconductor light emitting element 1 is disposed on the multilayer chip varistor 11.

First, a configuration of multilayer chip varistor 11 will be described. The multilayer chip varistor 11 comprises a varistor element body 21 of an approximately rectangular parallelepiped shape, a plurality of (a pair of, in the present embodiment) first external electrodes 25, 26, and a plurality of (a pair of, in the present embodiment) second external electrodes 27, 28.

The pair of first external electrodes 25, 26 are disposed each on a first principal surface (outer surface) 22 of the varistor element body 21. The pair of second external electrodes 27, 28 are disposed each on a second principal surface (outer surface) 23 of the varistor element body 21. The varistor element body 21 is set, for example, to the vertical length of about 1.0 mm, the horizontal length of about 0.5 mm, and the thickness of about 0.3 mm. The external electrode 25 functions as an input terminal electrode of multilayer chip varistor 11, and the external electrode 26 functions as an output terminal electrode of the multilayer chip varistor 11. The external electrodes 27, 28 function as pad electrodes electrically connected to the after-described semiconductor light emitting element 1.

The varistor element body 21 is constructed as a multilayer body in which a plurality of varistor layers to exhibit nonlinear voltage-current characteristics (hereinafter referred to as "varistor characteristics"), and first internal electrode 31 and second internal electrode 41 are laminated. The first internal electrode 31 and the second internal electrode 41 are arranged each in one layer along a laminate direction of varistor layers (hereinafter referred to simply as "laminate direction") in the varistor element body 21. The first internal electrode 31 and second internal electrode 41 are arranged to interpose at least one varistor layer between them. The first internal electrode 31 and second internal electrode 41 are juxtaposed along the laminate direction of the varistor layers. In practical multilayer chip varistor 11, the plurality of varistor layers are integrally formed so that no boundary can be visually recognized between them.

A pair of principal surfaces 22, 23 of the varistor element body 21 face each other. The pair of principal surfaces 22, 23 extend in a direction parallel to the laminate direction of the varistor layers, and the pair of principal surfaces 22, 23 also extend in parallel to the direction parallel to the varistor layers.

The varistor layers contain ZnO (zinc oxide) as a principal component and also contain as accessory components single metals, such as rare-earth metals, Co, IIIb elements (B, Al, Ga, In), Si, Cr, Mo, alkali metal elements (K, Rb, Cs), and alkaline earth metals (Mg, Ca, Sr, Ba), or oxides of these. In the present embodiment, the varistor layers contain Pr, Co, Cr, Ca, Si, K, Al, etc. as accessory components. For this reason, a region overlapping in the varistor layer with the first internal electrode 31 and with the second internal electrode 41 contains ZnO as a principal component and also contains Pr.

In the present embodiment, Pr is used as a rare-earth metal. Pr is a material for letting the varistor layer exhibit the varistor characteristics. The reason why Pr is used is that it has excellent nonlinear voltage-current characteristics and little characteristic variation in volume production. There are no particular restrictions on the content of ZnO in the varistor layers, but it is normally 99.8-69.0% by mass, relative to 100% by mass of all the materials making the varistor layers. The thickness of the varistor layers is, for example, about 5-60 μm.

The first internal electrode 31, as also shown in FIG. 3, includes a first electrode portion 33 and second electrode portions 35a, 35b. The first electrode portion 33, when viewed from the laminate direction, overlaps with a first electrode portion 43 of after-described second internal electrode 41. The first electrode portion 33 is of an approximately rectangular shape. The second electrode portion 35a is led from the first electrode portion 33 so as to be exposed in the first principal surface 22, and functions as a lead conductor. The second electrode portion 35a is mechanically (physically) and electrically connected to the external electrode 25. The second electrode portion 35b is led from the first electrode portion 33 so as to be exposed in the second principal surface 23, and functions as a lead conductor. The second electrode portion 35b is mechanically (physically) and electrically connected to the external electrode 27. The first electrode portion 33 is electrically connected through the second electrode portion 35a to the external electrode 25 and electrically connected through the second electrode portion 35b to the external electrode 27. The second electrode portions 35a, 35b are integrally formed with the first electrode portion 33.

The second internal electrode 41, as also shown in FIG. 4, includes a first electrode portion 43, and second electrode portions 45a, 45b. The first electrode portion 43, when viewed from the laminate direction, overlaps with the first electrode portion 33 of first internal electrode 31. The first electrode portion 43 is of an approximately rectangular shape. The second electrode portion 45a is led from the first electrode portion 43 so as to be exposed in the first principal surface 22, and functions as a lead conductor. The second electrode portion 45a is mechanically (physically) and electrically connected to the external electrode 26. The second electrode portion 45b is led from the first electrode portion 43 so as to be exposed in the second principal surface 23, and functions as a lead conductor. The second electrode portion 45b is mechanically (physically) and electrically connected to the external electrode 28. Each first electrode portion 43 is electrically connected through the second electrode portion 45a to the external electrode 26 and electrically connected through the second electrode portion 45b to the external electrode 28. The second electrode portions 45a, 45b are integrally formed with the first electrode portion 43.

The first and second internal electrodes 31, 41 contain an electroconductive material. There are no particular restrictions on the electroconductive material contained in the first and second internal electrodes 31, 41, but it is preferably Pd, or Ag—Pd alloy. The thickness of the first and second internal electrodes 31, 41 is, for example, about 0.5-5 μm.

The first external electrode 25 and the first external electrode 26 are arranged with a predetermined space in a direction normal to the laminate direction of the varistor layers and parallel to the first principal surface 22, on the first principal surface 22. The first external electrodes 25, 26 are of a rectangular shape (square shape in the present embodiment). The first external electrodes 25, 26 are set, for example, to the length of about 300 μm on each side and the thickness of about 5 μm.

The second external electrode 27 and the second external electrode 28 are arranged with a predetermined space in a direction normal to the laminate direction of the varistor layers and parallel to the second principal surface 23, on the second principal surface 23. The second external electrodes 27, 28 are of a rectangular shape (square shape in the present embodiment). The second external electrodes 27, 28 are set, for example, to the length of about 300 μm on each side and the thickness of about 5 μm.

Each external electrode 25-28 has a first electrode layer 25a-28a and a second electrode layer 25b-28b. The first electrode layers 25a, 26a are disposed on the first principal surface 22 of the varistor element body 21 and contain Pd. The first electrode layers 27a, 28a are disposed on the second principal surface 23 of the varistor element body 21 and contain Pd. The first electrode layers 25a-28a are formed by firing an electroconductive paste, as described later. The electroconductive paste can be a paste in which an organic binder and an organic solvent are mixed in metal powder consisting primarily of Pd particles. The metal powder may be one consisting primarily of Ag—Pd alloy particles.

The second electrode layers 25b-28b are arranged on the first electrode layers 25a-28a. The second electrode layers 25b-28b are formed by printing or by plating. The second electrode layers 25b-28b are made of Au or Pt. When the printing method is applied, a electroconductive paste prepared is one in which an organic binder and an organic solvent are mixed in metal powder consisting primarily of Au particles or Pt particles, the electroconductive paste is printed on the first electrode layers 25a-28a, and it is baked or fired to form the second electrode layers 25b-28b. When the plating method is applied, Au or Pt is evaporated by a vacuum plating method (vacuum evaporation, sputtering, ion plating, or the like) to form the second electrode layers 25b-28b. The second electrode layers 25b-28b may also be constructed as a laminate of Pt/Au.

The first electrode portion 33 of the first internal electrode 31 overlaps with the first electrode portion 43 of the second internal electrode 41 between the first internal electrode 31 and second internal electrode 41 adjacent to each other, as described above. Therefore, a region of the varistor layer overlapping with the first electrode portion 33 and with the first electrode portion 43 functions as a region to exhibit the varistor characteristics. In the multilayer chip varistor 11 having the above-described configuration, one varistor portion is composed of the first electrode portion 33, the first electrode portion 43, and the region of the varistor layer overlapping with the first electrode portion 33 and with the first electrode portion 43.

Figure 5:
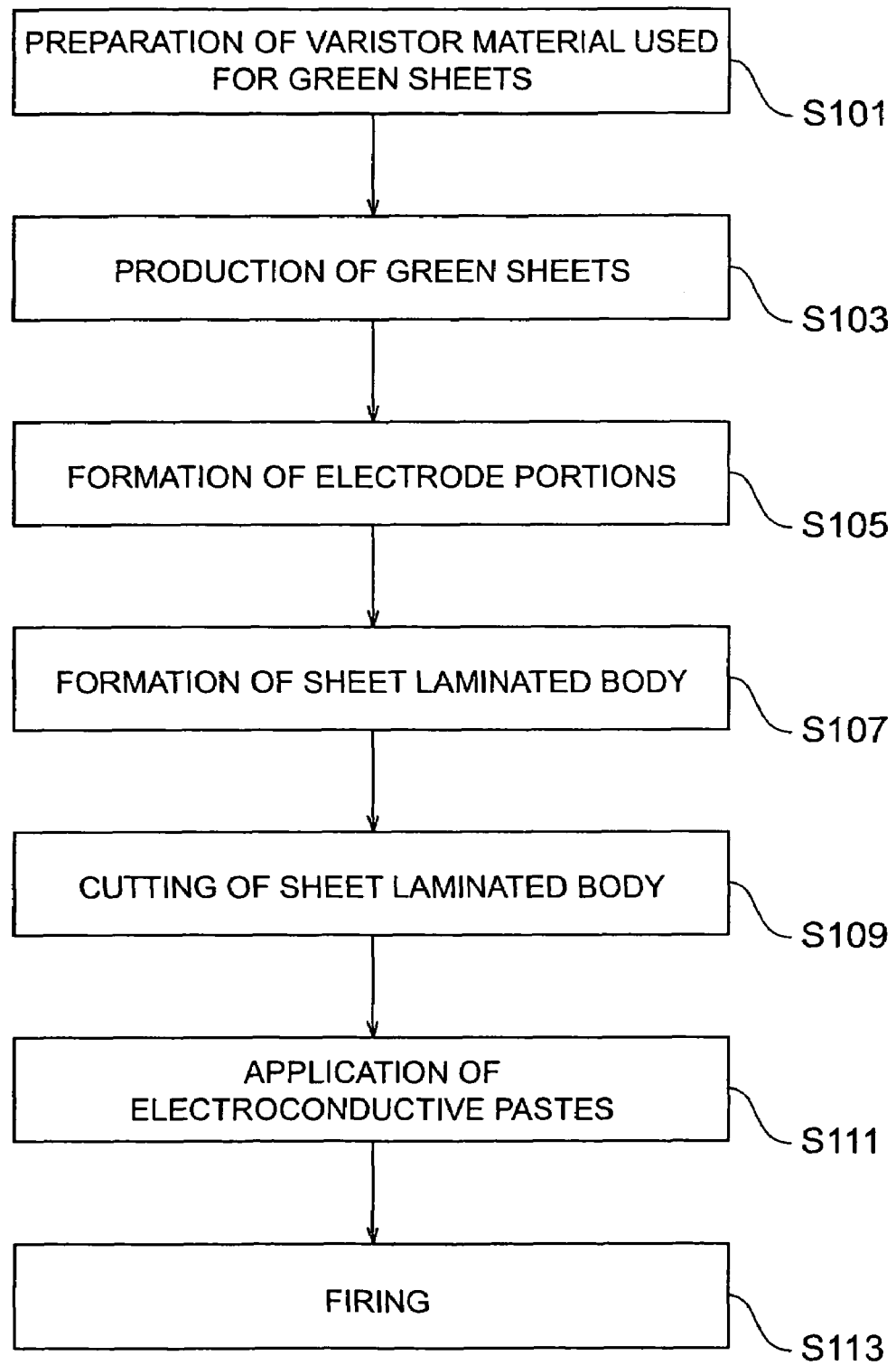
FIG. 5 is a flowchart for explaining a production process of a multilayer chip varistor according to the first embodiment.
Figure 6:
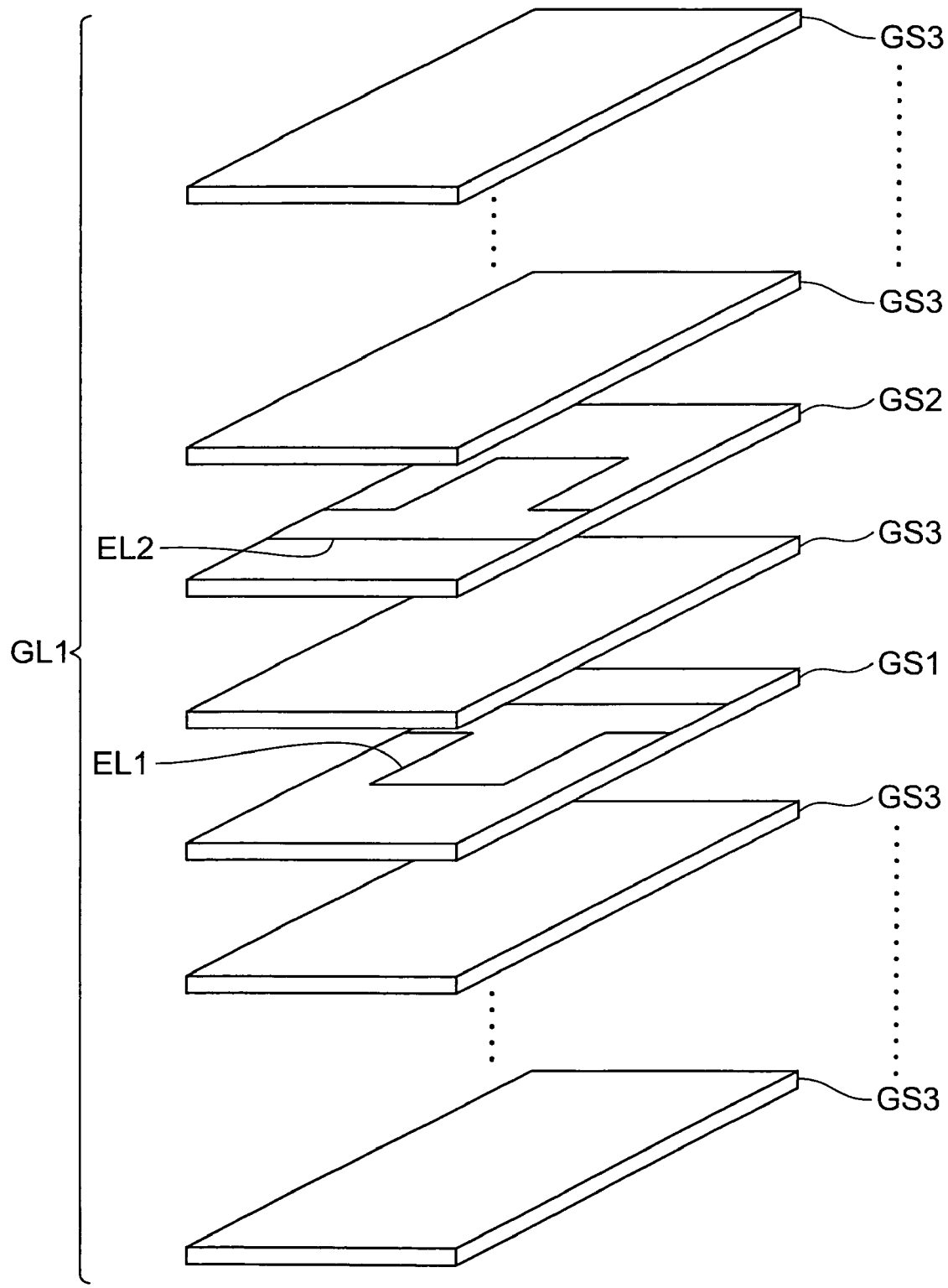
FIG. 6 is an illustration for explaining the production process of the multilayer chip varistor according to the first embodiment.

Subsequently, a production process of multilayer chip varistor 11 having the above-described configuration will be described with reference to FIGS. 5 and 6. FIG. 5 is a flowchart for explaining the production process of the multilayer chip varistor according to the first embodiment. FIG. 6 is an illustration for explaining the production process of the multilayer chip varistor according to the first embodiment.

First, each of ZnO as the principal component forming the varistor layers, and the additives of small amount, such as Pr, Co, Cr, Ca, Si, K, and Al, is weighed at a predetermined ratio, and then they are mixed to prepare a varistor material (step S101). Thereafter, an organic binder, an organic solvent, an organic plasticizer, etc. are added into this varistor material, and they are mixed and pulverized for about 20 hours by means of a ball mill or the like to obtain a slurry.

The slurry is applied onto film, for example, of polyethylene terephthalate by a known method, such as the doctor blade method, and thereafter dried to form membranes in the thickness of about 30 μm. The membranes obtained are peeled off from the polyethylene terephthalate film to obtain green sheets (step S103).

Next, a plurality of electrode portions corresponding to the first and second internal electrodes 31, 41 are formed (in a number corresponding to the number of divided chips described later) on green sheets (step S105). The electrode portions corresponding to the first and second internal electrodes 31, 41 are formed by printing an electroconductive paste as a mixture of metal powder consisting primarily of Pd particles, an organic binder, and an organic solvent by a printing method, such as screen printing, and drying it.

Next, the green sheets with the electrode portions, and green sheets without electrode portions are laminated in a predetermined order to form a sheet laminated body (step S107). The sheet laminated body obtained is cut in chip units to obtain a plurality of divided green bodies GL1 (cf. FIG. 6) (step S109). Each green body GL1 thus obtained consists of a successive laminate of a green sheet GS1 with electrode portion EL1 corresponding to the first internal electrode 31, a green sheet GS2 with electrode portion EL2 corresponding to the second internal electrode 41, and green sheets GS3 without electrode portions EL1, EL2. The green sheet GS3 located between green sheet GS1 and green sheet GS2 may be a laminate of multiple sheets, or may be excluded.

Next, a electroconductive paste for first electrode layers 25a-28a and a electroconductive paste for second electrode layers 25b-28b are applied onto outer surfaces of green body GL1 (step S111). In this step, electrode portions corresponding to the first electrode layers 25a, 26a are formed by printing the electroconductive paste by screen printing so as to contact the corresponding electrode portions EL1, EL2, on the first principal surface of the green body GL1, and drying it. Then electrode portions corresponding to the second electrode layers 25b, 26b are formed by printing the electroconductive paste by screen printing on the electrode portions corresponding to the first electrode layers 25a, 26a, and thereafter drying it. Electrode portions corresponding to the first electrode layers 27a, 28a are formed by printing the electroconductive paste by screen printing so as to contact the corresponding electrode portions EL1, EL2, on the second principal surface of the green body GL1, and thereafter drying it. Then electrode portions corresponding to the second electrode layers 27b, 28b are formed by printing the electroconductive paste by screen printing, on the electrode portions corresponding to the first electrode layers 27a, 28a, and drying it.

The electroconductive paste for the first electrode layers 25a-28a can be one in which an organic binder and an organic solvent are mixed in metal powder consisting primarily of Ag—Pd alloy particles or Pd particles, as described above. The electroconductive paste for the second electrode layers 25b-28b can be one in which an organic binder and an organic solvent are mixed in metal powder consisting primarily of Pt particles, as described above. These electroconductive pastes contain no glass frit.

Next, the green body GL1 with the electroconductive pastes thereon is subjected to a heat treatment at 180-400° C. and for about 0.5-24 hours to effect debinder, and thereafter it is further fired at 1000-1400° C. for about 0.5-8 hours (step S113) to obtain the varistor element body 21, the first electrode layers 25a-28a, and the second electrode layers 25b-28b. This firing turns the green sheets GS1-GS3 in the green body GL1 into the varistor layers. The electrode portion EL1 becomes the first internal electrode 31. The electrode portion EL2 becomes the second internal electrode 41.

The above process yields the multilayer chip varistor 11. An alkali metal (e.g., Li, Na, or the like) may be diffused from a surface of the varistor element body 21 after the firing.

Next, the configuration of semiconductor light emitting element 1 will be described with reference to FIGS. 3 and 4.

The semiconductor light emitting element 1 is a Light-Emitting Diode (LED) of a GaN (gallium nitride) semiconductor, and comprises a substrate 2, and a layer structure LS disposed on the substrate 2. The GaN semiconductor LED is well known and thus the description thereof is simplified herein. The substrate 2 is an optically transparent and electrically insulating substrate made of sapphire. The layer structure LS includes an n-type (first conductivity type) semiconductor region 3, a light emitting layer 4, and a p-type (second conductivity type) semiconductor region 5 which are laminated. The semiconductor light emitting element 1 emits light according to a voltage applied between the n-type semiconductor region 3 and the p-type semiconductor region 5.

The n-type semiconductor region 3 is made to contain an n-type nitride semiconductor. In the present embodiment, the n-type semiconductor region 3 is formed by epitaxial growth of GaN on the substrate 2 and is doped with an n-type dopant (e.g., Si or the like) to have the n-type conductivity. The n-type semiconductor region 3 may have such a composition that the refractive index thereof is smaller and the bandgap is larger than those of the light emitting layer 4. In this case, the n-type semiconductor region 3 functions as a lower cladding for the light emitting layer 4.

The light emitting layer 4 is formed on the n-type semiconductor region 3. In the light emitting layer 4, carriers (electrons and holes) supplied from the n-type semiconductor region 3 and from the p-type semiconductor region 5 are recombined to generate light in a light emitting region. The light emitting layer 4 can be constructed, for example, in the Multiple Quantum Well (MQW) structure in which multiple cycles of barrier layers and well layers are alternately laminated. In this case, the barrier layers and well layers are made of InGaN, and proportions of In (indium) are appropriately selected to make the bandgap of the barrier layers larger than the bandgap of the well layers. The light emitting region is generated in the region into which the carriers are injected, in the light emitting layer 4.

The p-type semiconductor region 5 is made to contain a p-type nitride semiconductor. In the present embodiment, the p-type semiconductor region 5 is made by epitaxial growth of AlGaN on the light emitting layer 4, and is doped with a p-type dopant (e.g., Mg or the like) to have the p-type conductivity. The p-type semiconductor region 5 may have such a composition that the refractive index thereof is smaller and the bandgap thereof is larger than those of the light emitting layer 4. In this case, the p-type semiconductor region 5 functions as an upper cladding for the light emitting layer 4.

A cathode electrode 6 is formed on the n-type semiconductor region 3. The cathode electrode 6 is made of an electrically conductive material and is kept in ohmic contact with the n-type semiconductor region 3. An anode electrode 7 is formed on the p-type semiconductor region 5. The anode electrode 7 is made of an electrically conductive material and is kept in ohmic contact with the p-type semiconductor region 5. A bump electrode 8 is formed on each of the cathode electrode 6 and anode electrode 7.

In the semiconductor light emitting element 1 of the above-described configuration, a predetermined voltage is applied between the anode electrode 7 (bump electrode 8) and the cathode electrode 6 (bump electrode 8) to allow an electric current to flow, whereby emission of light is induced in the light emitting region of the light emitting layer 4.

The semiconductor light emitting element 1 is bump-connected to a pair of second external electrodes 27, 28. Namely, the cathode electrode 6 is electrically and mechanically connected through the bump electrode 8 to the second external electrode 28. The anode electrode 7 is electrically and mechanically connected through the bump electrode 8 to the second external electrode 27. This results in connecting the semiconductor light emitting element 1 in parallel to the varistor portion composed of the first electrode portion 33, the first electrode portion 43, and the region of the varistor layer overlapping with the first electrode portions 33, 43.

In the present first embodiment, as described above, the multilayer chip varistor 11 is connected in parallel to the semiconductor light emitting element 1, whereby the semiconductor light emitting element 1 can be protected from the ESD surge.

In the present first embodiment, the multilayer chip varistor 11 has the second external electrodes 27, 28 connected to the semiconductor light emitting element 1, and the first and second internal electrodes 31, 41 connected to the second external electrodes 27, 28. This causes the heat generated in the semiconductor light emitting element 1 to be transferred mainly to the second external electrodes 27, 28 and to the first and second internal electrodes 31, 41 and to radiate. The heat radiation path is expanded for the heat generated in the semiconductor light emitting element 1, so that the heat generated in the semiconductor light emitting element 1 can be efficiently diffused.

In the present first embodiment, the varistor layers contain ZnO as a principal component. ZnO has the thermal conductivity approximately equal to that of alumina or the like normally used as a heat radiation substrate, and has the thermal conductivity relatively good. Therefore, it is feasible to prevent the varistor layers from inhibiting the diffusion of heat from the first and second internal electrodes 31, 41.

Incidentally, in the multilayer chip varistor 11 of the first embodiment the first external electrode 25 functioning as an input terminal electrode and the first external electrode 26 functioning as an output terminal electrode are arranged on the first principal surface 22 of the varistor element body 21. Namely, the multilayer chip varistor 11 is a multilayer chip varistor arranged as a BGA (Ball Grid Array) package. This multilayer chip varistor 11 is mounted on an external substrate, an external device, or the like by electrically and mechanically connecting the first external electrodes 25, 26 to respective lands corresponding to the first external electrodes 25, 26 by means of solder balls, bump electrodes, or the like.

In the first embodiment, the green body GL1 contains Pr, the electroconductive paste for the electrode layers $25a$-$28a$ contains Pd, and the green body GL1 with the electroconductive paste is fired to obtain the varistor element body 21 and the first electrode layers $25a$-$28a$; therefore, the varistor element body 21 and the first electrode layers $25a$-$28a$ are simultaneously fired. This can achieve an improvement in the bonding strength between the varistor element body 21 and the first and second external electrodes 25-28 (first electrode layers $25a$-$28a$).

The effect of the improvement in the bonding strength between the varistor element body 21 and the first and second external electrodes 25-28 (first electrode layers $25a$-$28a$) is considered to arise from the following phenomenon during the firing. During the firing of the green body GL1 and the electroconductive paste, Pr in the green body GL1 migrates to near the surface of the green body GL1, i.e., to near the interface between the green body GL1 and the electroconductive paste. Then Pr coming to near the interface between the green body GL1 and the electroconductive paste, and Pd in the electroconductive paste counter-diffuse. The counter diffusion of Pr and Pd can result in forming an oxide of Pr and Pd (e.g., $Pr_2Pd_2O_5$ or $Pr_4PdO_7$ or the like) in the neighborhood of interfaces (including the interfaces) between the varistor element body 21 and the first electrode layers $25a$-$28a$. This oxide of Pr and Pd offers the anchor effect to achieve the improvement in the bonding strength between the varistor element body 21 and external electrodes 25-28 obtained by the firing.

The multilayer chip varistor arranged as a BGA package has the particularly small area of the external electrodes functioning as the input/output terminal electrodes or ground terminal electrodes. For this reason, the bonding strength is low between the varistor element body and the external electrodes, and the external electrodes could be peeled off from the varistor element body. However, the multilayer chip varistor 11 of the first embodiment is improved in the bonding strength between the varistor element body 21 and the first and second external electrodes 25-28 (first electrode layers $25a$-$28a$) as described above, and thus the first and second external electrodes 25-28 are prevented from being peeled off from the varistor element body 21.

If the electroconductive paste for formation of the first electrode layers $25a$-$28a$ should contain glass frit, the glass component could separate out to the surfaces of the first electrode layers $25a$-$28a$ during the firing to degrade plateability and solder wettability. However, since in the present first embodiment the electroconductive paste for formation of the first electrode layers $25a$-$28a$ contains no glass frit, there occurs no degradation of plateability and solder wettability.

In the present first embodiment, the pair of first external electrodes 25, 26 are disposed on the first principal surface 22 of the varistor element body 21, and the pair of second external electrodes 27, 28 are disposed on the second principal surface 23. The first and second internal electrodes 31, 41 include the first electrode portions 33, 43 overlapping with each other, and the second electrode portions $35a$, $35b$, $45a$, $45b$ led from the first electrode portions 33, 43 so as to be exposed in the first principal surface 22 and in the second principal surface 23. The first and second external electrodes 25-28 are electrically connected through the second electrode portions $35a$, $35b$, $45a$, $45b$ to the corresponding internal electrodes 31, 41. In this case, the semiconductor light emitting element 1 is connected to the second external electrodes 27, 28 to be mounted on the multilayer chip varistor 11.

Therefore, the mounting for electrically and mechanically connecting the semiconductor light emitting element 1 to the second external electrodes 27, 28 can be easily and simply carried out. The multilayer chip varistor 11 is mounted on an external substrate, an external device, or the like in a state in which the first principal surface 22 faces the external substrate, the external device, or the like. Therefore, it is also feasible to achieve easy and simple mounting of the multilayer chip varistor 11.

In the present first embodiment, the semiconductor light emitting element 1 is bump-connected to the pair of second external electrodes 27, 28 to be disposed on the multilayer chip varistor 11. This enables extremely easy and simple mounting of the semiconductor light emitting element 1 onto the multilayer chip varistor 11.

In the present first embodiment, the first principal surface 22 and the second principal surface 23 extend in the direction parallel to the laminate direction of the varistor element body 21, i.e., the laminate direction of the varistor layers. For this reason, the first and second internal electrodes 31, 41 are juxtaposed along the direction in which the first principal surface 22 and second principal surface 23 extend. This results in, for each internal electrode 31, 41, decreasing the heat radiation path from the internal electrode 31, 41 to the first principal surface 22 and the second principal surface 23, i.e., the heat radiation path to the outer surfaces of the multilayer chip varistor 11, whereby it becomes feasible to achieve more efficient diffusion of heat from the first and second internal electrodes 31, 41.

Second Embodiment

Figure 7:
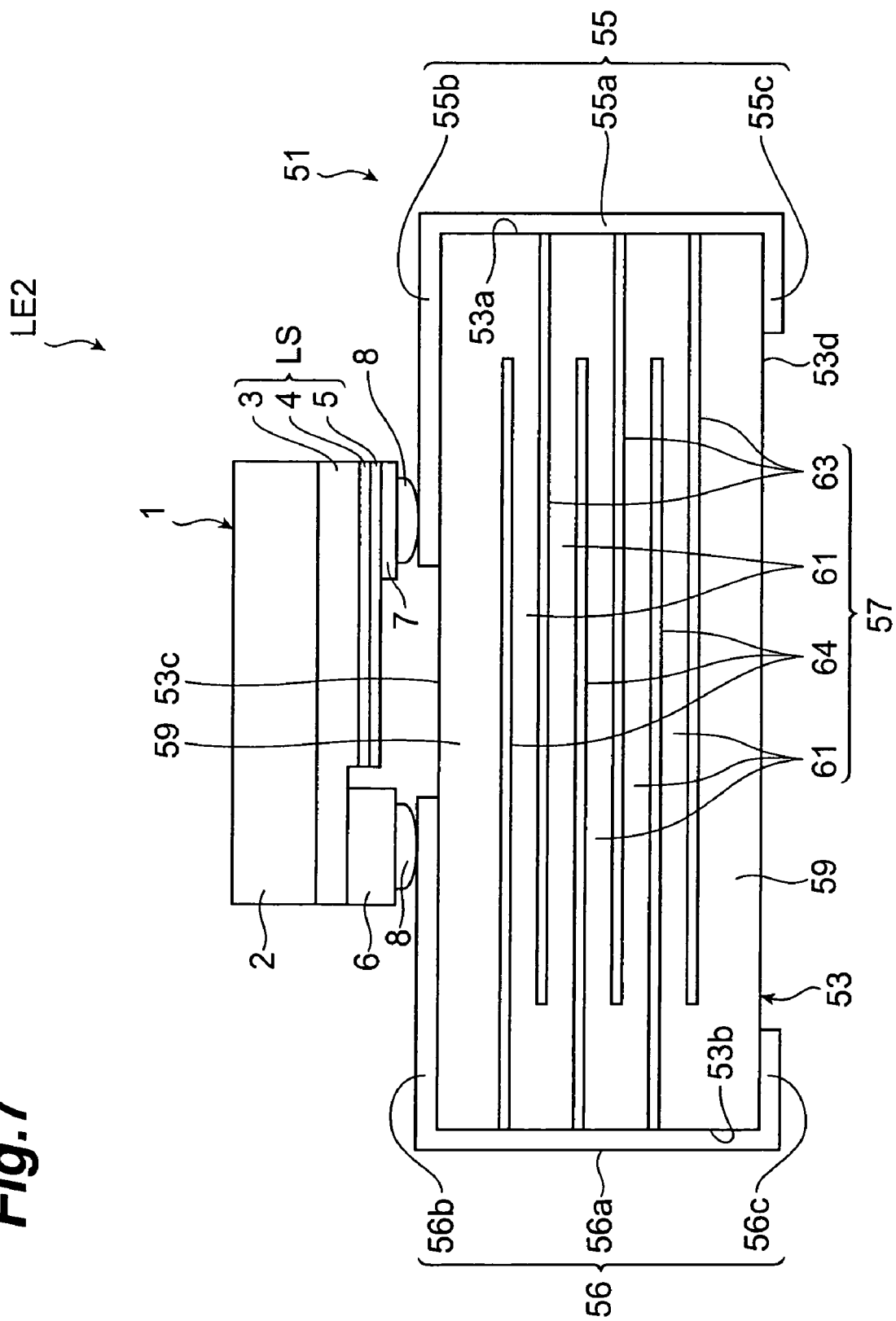
FIG. 7 is a view for explaining a sectional configuration of a light emitting device according to the second embodiment.

A configuration of light emitting device LE2 according to the second embodiment will be described with reference to FIG. 7. FIG. 7 is a view for explaining a sectional configuration of the light emitting device according to the second embodiment. The light emitting device LE2 of the second embodiment is different in the configuration of the multilayer chip varistor from the light emitting device LE1 of the first embodiment.

The light emitting device LE2, as shown in FIG. 7, comprises a semiconductor light emitting element 1 and a multilayer chip varistor 51. The semiconductor light emitting element 1 is disposed on the multilayer chip varistor 51. The multilayer chip varistor 51 comprises 5 a multilayer body 53, and a pair of external electrodes 55, 56. The pair of external electrodes 55, 56 are disposed each on outer surfaces of multilayer body 53. The external electrode 55 functions as an input terminal electrode of the multilayer chip varistor 51, and the external electrode 56 as an output terminal electrode of the multilayer chip varistor 51.

The multilayer body 53 has a varistor portion 57, and a pair of outer portions 59 arranged to interpose the varistor portion 57 between them. The multilayer body 53 is constructed in a configuration in which the varistor portion 57 and the pair of outer portions 59 are stacked. The multilayer body 53 is of a rectangular parallelepiped shape. The multilayer body 53 includes a pair of end faces (outer surfaces) 53a, 53b, and a pair of side faces (outer surfaces) 53c, 53d. The pair of end faces 53a, 53b face each other and extend in a direction parallel to the laminate direction of the multilayer body 53. The pair of side faces 53c, 53d face each other and are adjacent to the pair of end faces 53a, 53b. The pair of side faces 53c, 53d are perpendicular to the laminate direction of the multilayer body 53.

The varistor portion 57 includes varistor layers 61 to exhibit the varistor characteristics, and a plurality of internal electrodes 63, 64 arranged to interpose each of the varistor layers 61 between them. In the varistor portion 57, the varistor layers 61 and the internal electrodes 63, 64 are alternately laminated. A region overlapping in each varistor layer 61 with a pair of adjacent internal electrodes 63, 64 functions as a region to exhibit the varistor characteristics. The thickness of the internal electrodes 63, 64 is, for example, about 0.5-5 µm. In practical multilayer chip varistor 51, the varistor layers and the outer portions are integrally formed so that no boundary can be visually recognized between the varistor layers 61 and between the varistor layers 61 and the outer portions 59.

The varistor layers 61 contain ZnO as a principal component and also contain as accessory components single metals, such as rare-earth metals, Co, IIIb elements (B, Al, Ga, In), Si, Cr, Mo, alkali metal elements (K, Rb, Cs), and alkaline earth metals (Mg, Ca, Sr, Ba), or oxides thereof In the present embodiment, the varistor layers contain Pr, Co, Cr, Ca, Si, K, Al, etc. as accessory components. In this configuration, the region of each varistor layer overlapping with a pair of adjacent internal electrodes 63, 64 contains ZnO as a principal component and also contains Pr. In the present embodiment, Pr is used as a rare-earth metal as in the first embodiment.

The plurality of internal electrodes 63, 64 are provided approximately in parallel so that one ends of the respective internal electrodes are alternately exposed in each end face 53a, 53b. Each internal electrode 63, 64 contains an electroconductive material. There are no particular restrictions on the electroconductive material contained in each internal electrode 63, 64, but it is preferably Pd, or Ag—Pd alloy. The plurality of internal electrodes 63, 64 are juxtaposed along the laminate direction of the multilayer body 53, i.e., along the facing direction of the pair of side faces 53c, 53d.

The outer portions 59 contain ZnO as a principal component and also contain as accessory components single metals, such as rare-earth metals, Co, IIIb elements (B, Al, Ga, In), Si, Cr, Mo, alkali metal elements (K, Rb, Cs), and alkaline earth metals (Mg, Ca, Sr, Ba), or oxides thereof as the varistor layers 61 do. In the present embodiment, the outer portions 59 contain Pr, Co, Cr, Ca, Si, K, Al, etc. as accessory components in the outer portions 59. In the present embodiment Pr is used as a rare-earth metal.

The pair of external electrodes 55-56 are provided so as to cover the two ends of the multilayer body 53. Each of the pair of external electrodes 55, 56 includes a first electrode portion 55a, 56a, a second electrode portion 55b, 56b, and a third electrode portion 55c, 56c. The first electrode portion 55a is disposed on the end face 53a. The first electrode portion 56a is disposed on the end face 53b. The second electrode portion 55b is disposed on the side face 53c so as to be continuous to the first electrode portion 55a. The second electrode portion 56b is disposed on the side face 53c so as to be continuous to the first electrode portion 56a. The third electrode portion 55c is disposed on the side face 53d so as to be continuous to the first electrode portion 55a. The third electrode portion 56c is disposed on the side face 53d so as to be continuous to the first electrode portion 56a.

The internal electrodes 63 are mechanically (physically) and electrically connected at the exposed ends in the end face 53a to the first electrode portion 55a of the external electrode 55. The internal electrodes 64 are mechanically (physically) and electrically connected at the exposed ends in the end face 53b to the first electrode portion 56a of the external electrode 56.

The external electrodes 55, 56 contain Pd. The external electrodes 55, 56 are formed by firing an electroconductive paste. The electroconductive paste is one in which an organic binder and an organic solvent are mixed in metal powder consisting primarily of Ag—Pd alloy particles. The metal powder may be one consisting primarily of Pd particles. The external electrodes 55, 56 are obtained by simultaneous firing with the multilayer body 53, as in the first embodiment. A metal layer may be formed on the surfaces of the external electrodes 55, 56 so as to cover the external electrodes 55, 56. A material of this metal layer can be Au, Pt, Sn, Sn alloy, or Ag, for example. The metal layer can be formed by plating or the like.

The semiconductor light emitting element 1 is disposed on the side face 53*c* perpendicular to the laminate direction of the multilayer body 53 (varistor layers 61) and is bump-connected to the pair of external electrodes 55, 56. Namely, the cathode electrode 6 is electrically and mechanically connected through the bump electrode 8 to the external electrode 56. The anode electrode 7 is electrically and mechanically connected through the bump electrode 8 to the external electrode 55.

In the present second embodiment, as described above, the multilayer chip varistor 51 is connected in parallel to the semiconductor light emitting element 1, whereby the semiconductor light emitting element 1 can be protected from the ESD surge.

In the present second embodiment, the multilayer chip varistor 11 has the external electrodes 55, 56 connected to the semiconductor light emitting element 1, and the internal electrodes 63, 64 connected to the external electrodes 55, 56. This causes the heat generated in the semiconductor light emitting element 1 to be transferred mainly to the external electrodes 55, 56 and internal electrodes 63, 64 and to radiate. The heat radiation path is expanded for the heat generated in the semiconductor light emitting element 1, so that the heat generated in the semiconductor light emitting element 1 can be efficiently diffused.

In the present second embodiment, the varistor layers 61 contain ZnO as a principal component. ZnO has the thermal conductivity approximately equal to that of alumina or the like normally used as a heat radiation substrate, and has the thermal conductivity relatively good. Therefore, it is feasible to prevent the varistor layers 61 from inhibiting the diffusion of heat from the internal electrodes 63, 64.

In the second embodiment, as in the first embodiment, the multilayer body 53 and the external electrodes 55, 56 are obtained by simultaneous firing, whereby the bonding strength is improved between the multilayer body 53 and the external electrodes 55, 56.

Third Embodiment

Figure 8:
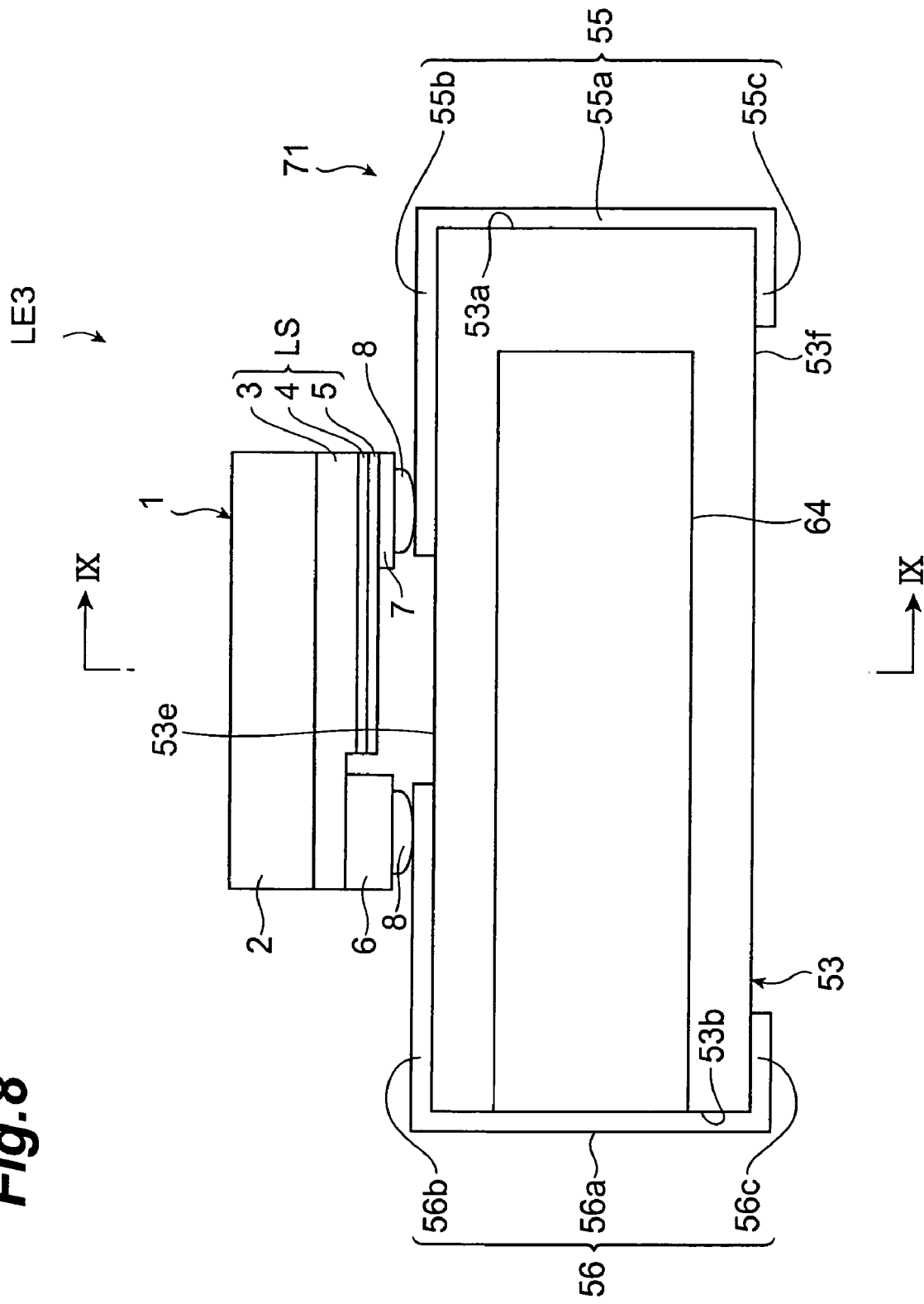
FIG. 8 is a view for explaining a sectional configuration of a light emitting device according to the third embodiment.
Figure 9:
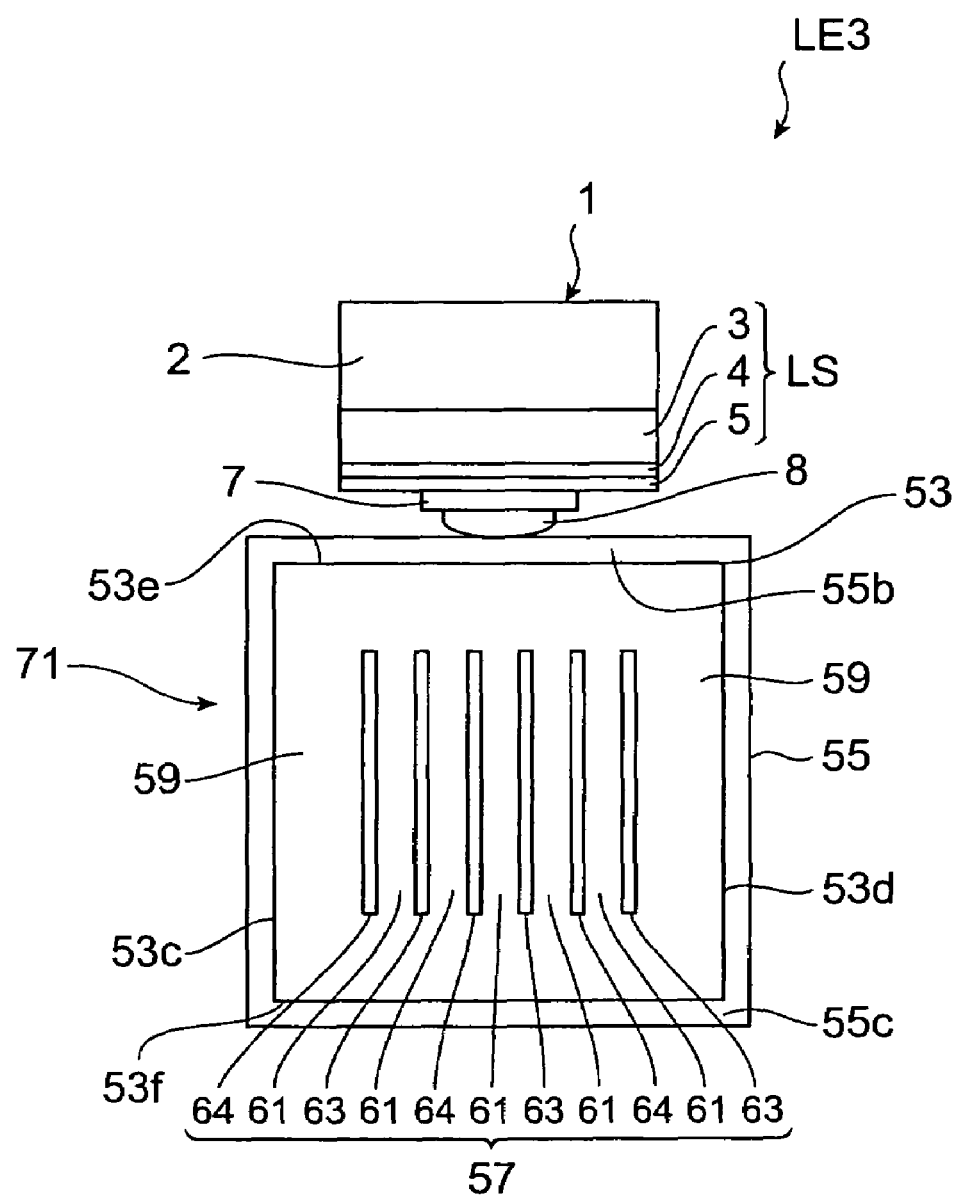
FIG. 9 is a view for explaining a sectional configuration along line IX-IX in FIG. 8.

A configuration of light emitting device LE3 according to the third embodiment will be described with reference to FIGS. 8 and 9. FIG. 8 is a view for explaining a sectional configuration of the light emitting device according to the third embodiment. FIG. 9 is a view for explaining a sectional configuration along line IX-IX in FIG. 8. The light emitting device LE3 of the third embodiment is different in the configuration of the multilayer chip varistor from the light emitting device LE1 of the first embodiment.

The light emitting device LE3, as shown in FIGS. 8 and 9, comprises a semiconductor light emitting element 1 and a multilayer chip varistor 71. The semiconductor light emitting element 1 is disposed on the multilayer chip varistor 71.

The multilayer chip varistor 71 comprises a multilayer body 53, and a pair of external electrodes 55, 56 as the multilayer chip varistor 51 of the second embodiment does. In the multilayer chip varistor 71, a plurality of internal electrodes 63, 64 are juxtaposed along the laminate direction (a facing direction of a pair of side faces 53*c*, 53*d*) of the multilayer body 53 (varistor layers 61). Namely, the plurality of internal electrodes 63, 64 are juxtaposed along a direction perpendicular to a facing direction of a pair of end faces 53*a*, 53*b*. The multilayer body 53 includes a pair of side faces (outer surfaces) 53*e*, 53*f*. The pair of side faces 53*e*, 53*f* face each other and are adjacent to the pair of end faces 53*a*, 53*b*. The pair of side faces 53*e*, 53*f* extend in a direction parallel to the laminate direction of the multilayer body 53.

The first electrode portion 55*a* of the external electrode 55 is disposed on the end face 53*a*. The first electrode portion 56*a* of the external electrode 56 is disposed on the end face 53*b*. The second electrode portions 55*b*, 56*b* are disposed on the side face 53*e* so as to be continuous to the corresponding first electrode portions 55*a*, 56*a*, respectively. The third electrode portions 55*c*, 56*c* are disposed on the side face 53*f* so as to be continuous to the first electrode portions 55*a*, 56*a*, respectively. The semiconductor light emitting element 1 is disposed on a surface extending in a direction parallel to the laminate direction of the multilayer body 53 in the multilayer chip varistor 71, i.e., on the side face 53*e* of the multilayer body 53.

In the present third embodiment, the multilayer chip varistor 71 is connected in parallel to the semiconductor light emitting element 1, so that the semiconductor light emitting element 1 can be protected from the ESD surge.

In the present third embodiment, as in the second embodiment, the multilayer chip varistor 11 also has the external electrodes 55, 56 connected to the semiconductor light emitting element 1, and the internal electrodes 63, 64 connected to the external electrodes 55, 56. This causes the heat generated in the semiconductor light emitting element 1 to be transferred mainly to the external electrodes 55, 56 and internal electrodes 63, 64 and to radiate. The heat radiation path is expanded for the heat generated in the semiconductor light emitting element 1, whereby the heat generated in the semiconductor light emitting element 1 can be efficiently diffused. Since the varistor layers 61 contain ZnO as a principal component, it is feasible to prevent the varistor layers 61 from inhibiting the diffusion of heat from the internal electrodes 63, 64.

In the present third embodiment, the semiconductor light emitting element 1 is arranged to face the side face 53*e*. The plurality of internal electrodes 63, 64 are juxtaposed in the direction in which the side face 53*e* extends. These result in, for each internal electrode 63, 64, decreasing the heat radiation path from the internal electrode 63, 64 to the outer surfaces of the multilayer chip varistor 71, whereby it is feasible to implement more efficient diffusion of heat from the internal electrodes 63, 64.

In the present third embodiment, each of the pair of external electrodes 55, 56 includes the first electrode portion 55*a*, 56*a* disposed on either of the pair of end faces 53*a*, 53*b*, and the second electrode portion 55*b*, 56*b* disposed on the side face 53*e*. In this case, the semiconductor light emitting element 1 is connected to the second electrode portions 55*b*, 56*b* to be mounted on the multilayer chip varistor 71. Accordingly, it is feasible to achieve easy and simple mounting for electrically connecting the semiconductor light emitting element 1 to the external electrodes 55, 56.

Fourth Embodiment

Figure 10:
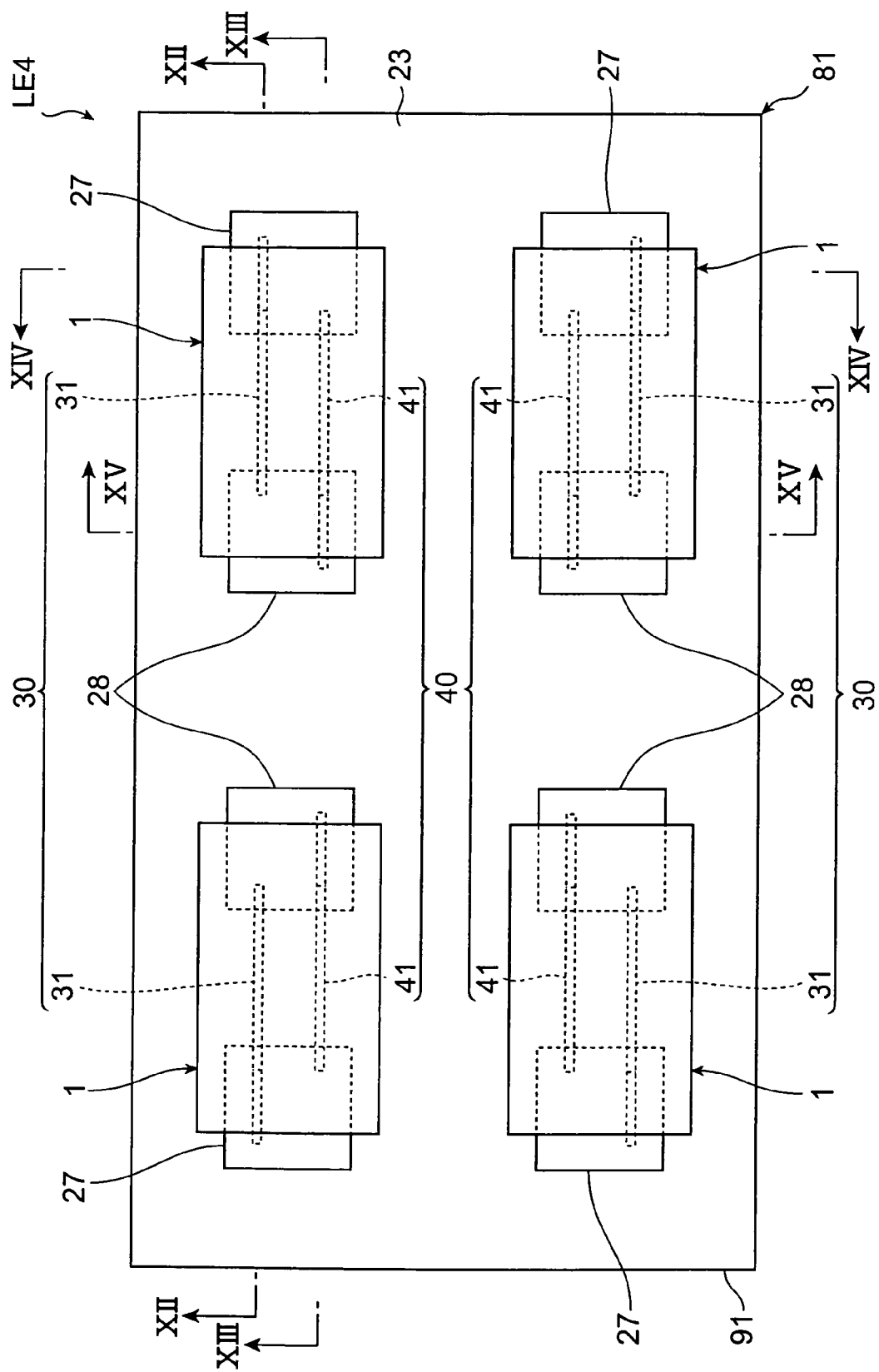
FIG. 10 is a schematic top view showing a light emitting device according to the fourth embodiment.

A configuration of light emitting device LE4 according to the fourth embodiment will be described with reference to FIGS. 10 to 15. FIG. 10 is a schematic top view showing the light emitting device according to the fourth embodiment.

Figure 11:
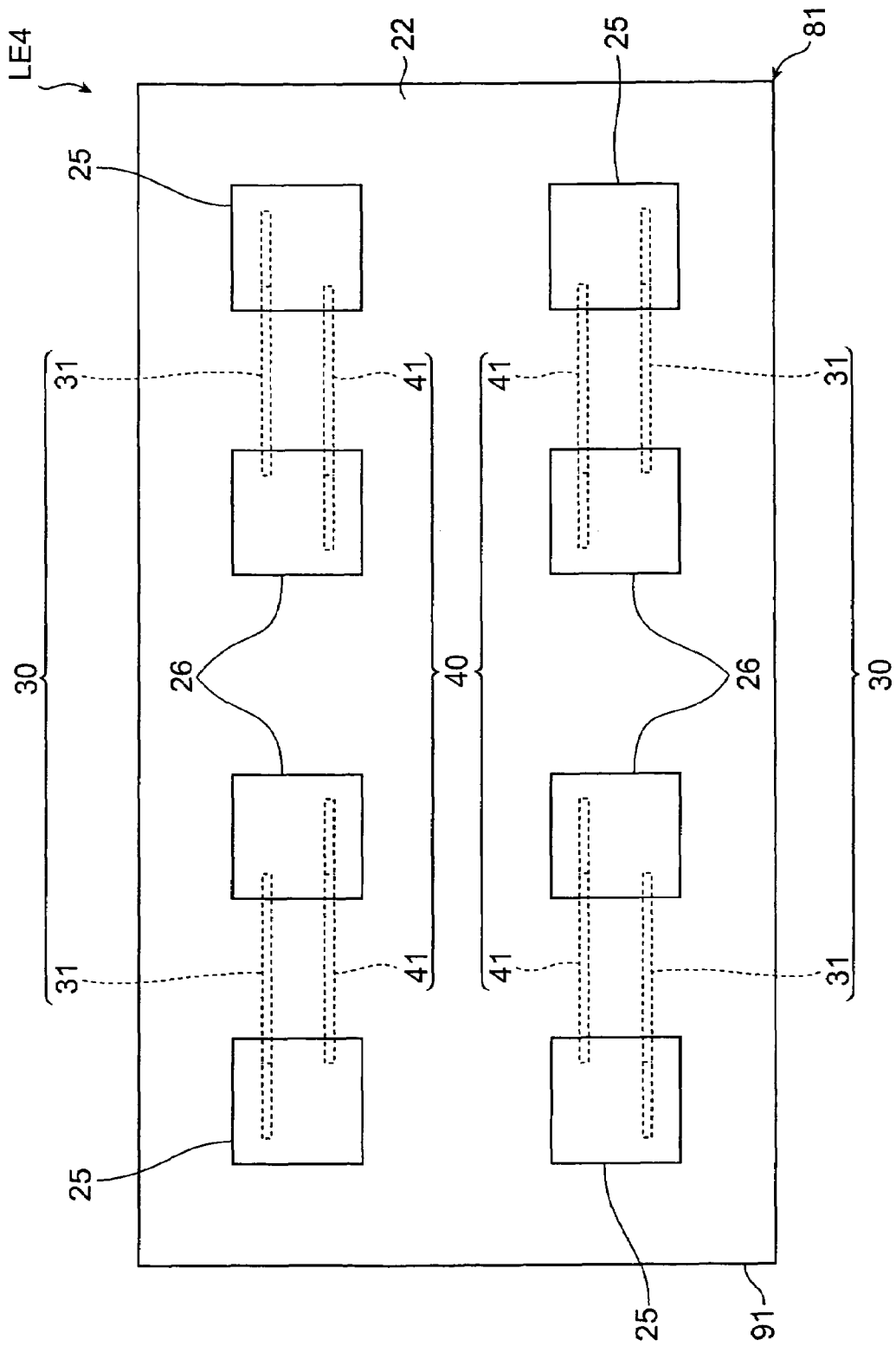
FIG. 11 is a schematic bottom view showing the light emitting device according to the fourth embodiment.
Figure 12:
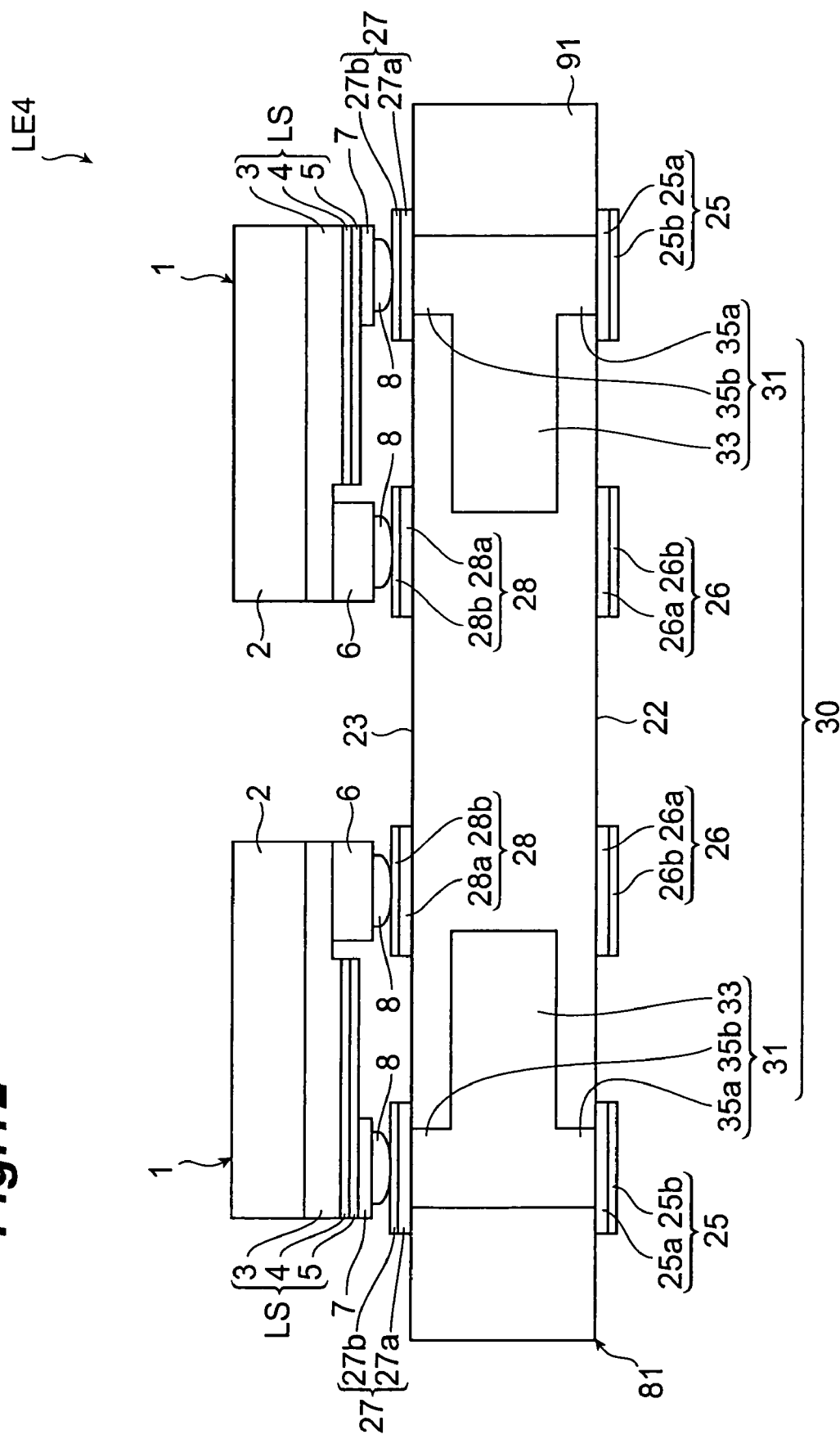
FIG. 12 is a view for explaining a sectional configuration along line XII-XII in FIG. 10.
Figure 13:
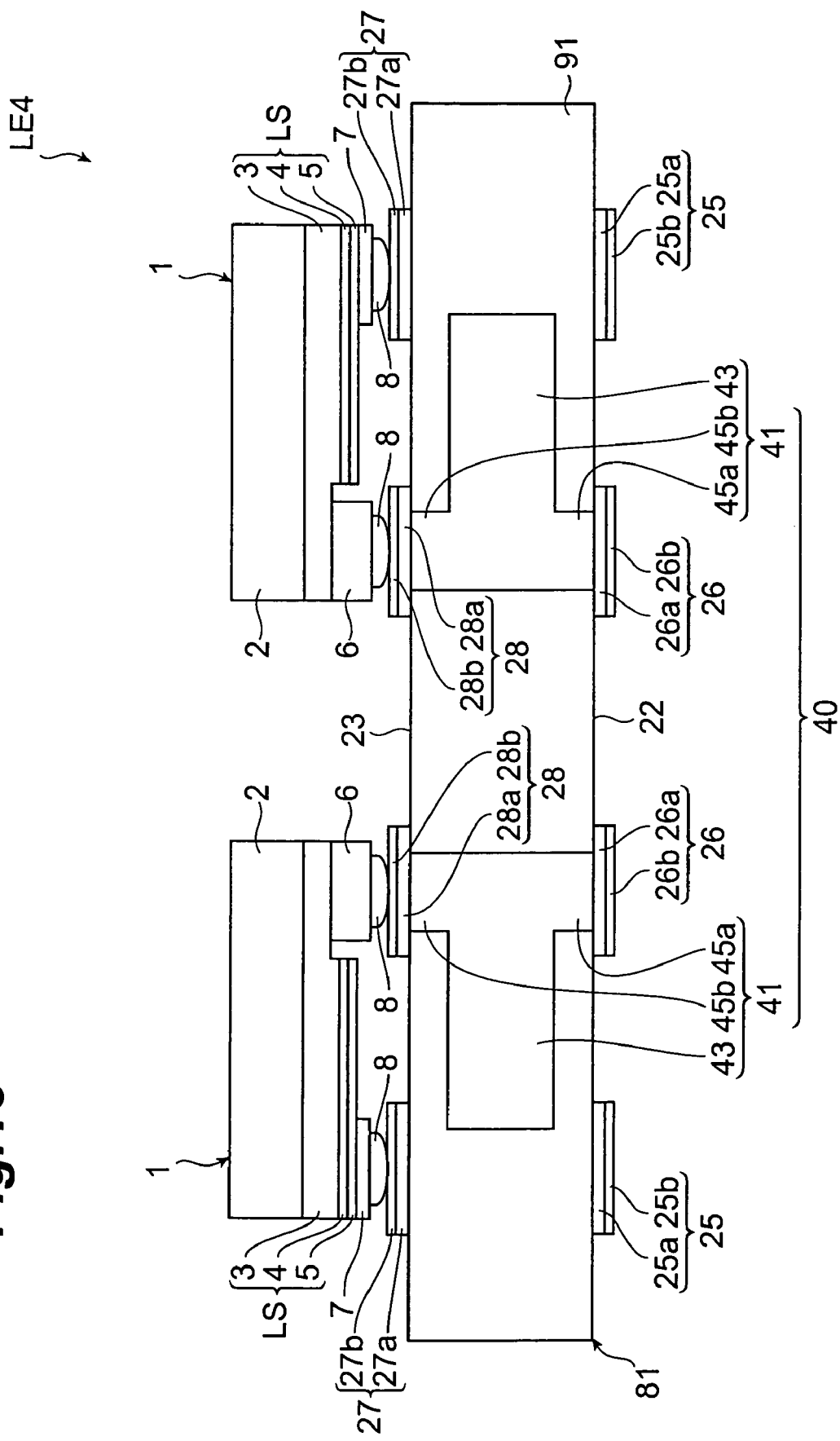
FIG. 13 is a view for explaining a sectional configuration along line XIII-XIII in FIG. 10.
Figure 14:
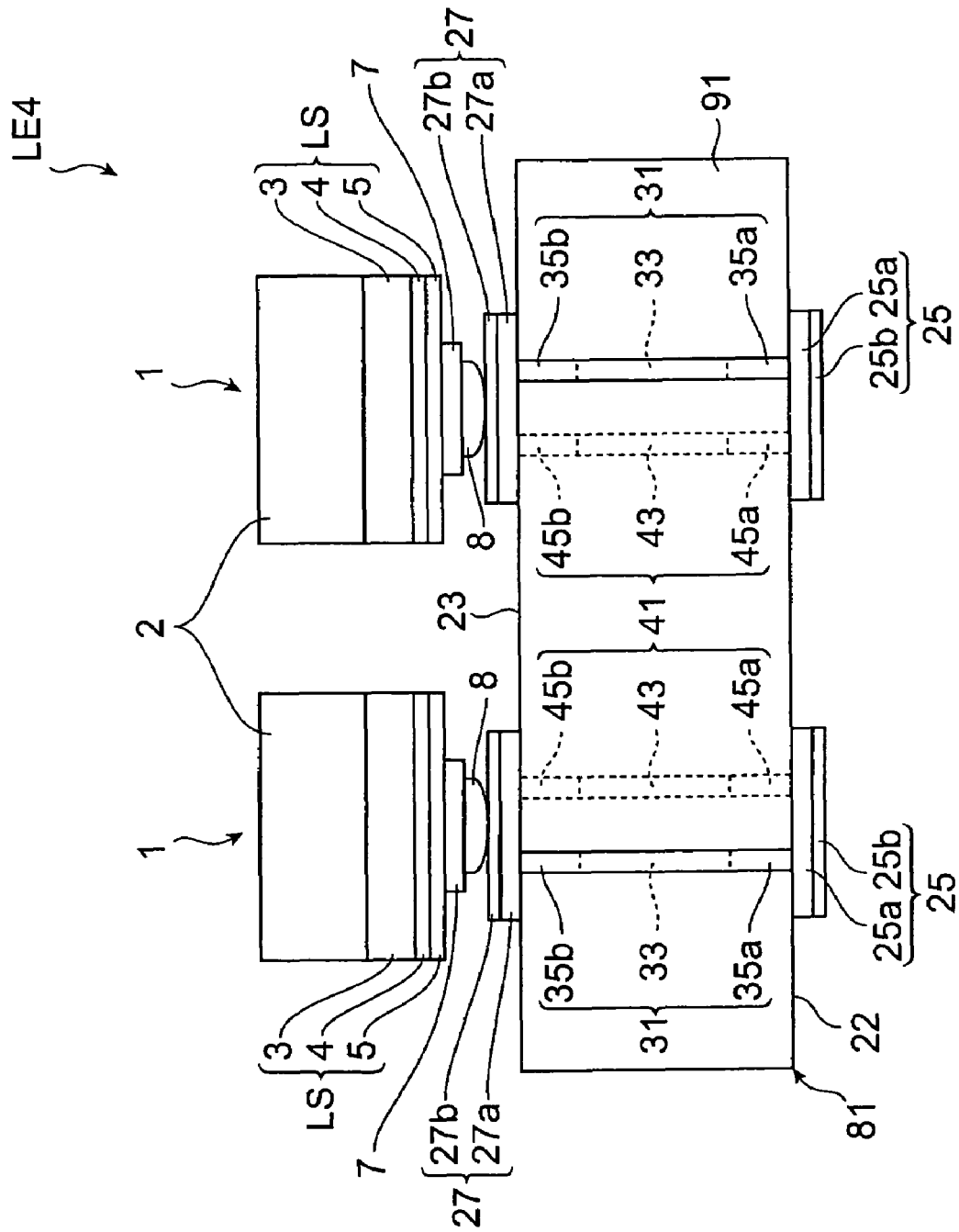
FIG. 14 is a view for explaining a sectional configuration along line XIV-XIV in FIG. 10.
Figure 15:
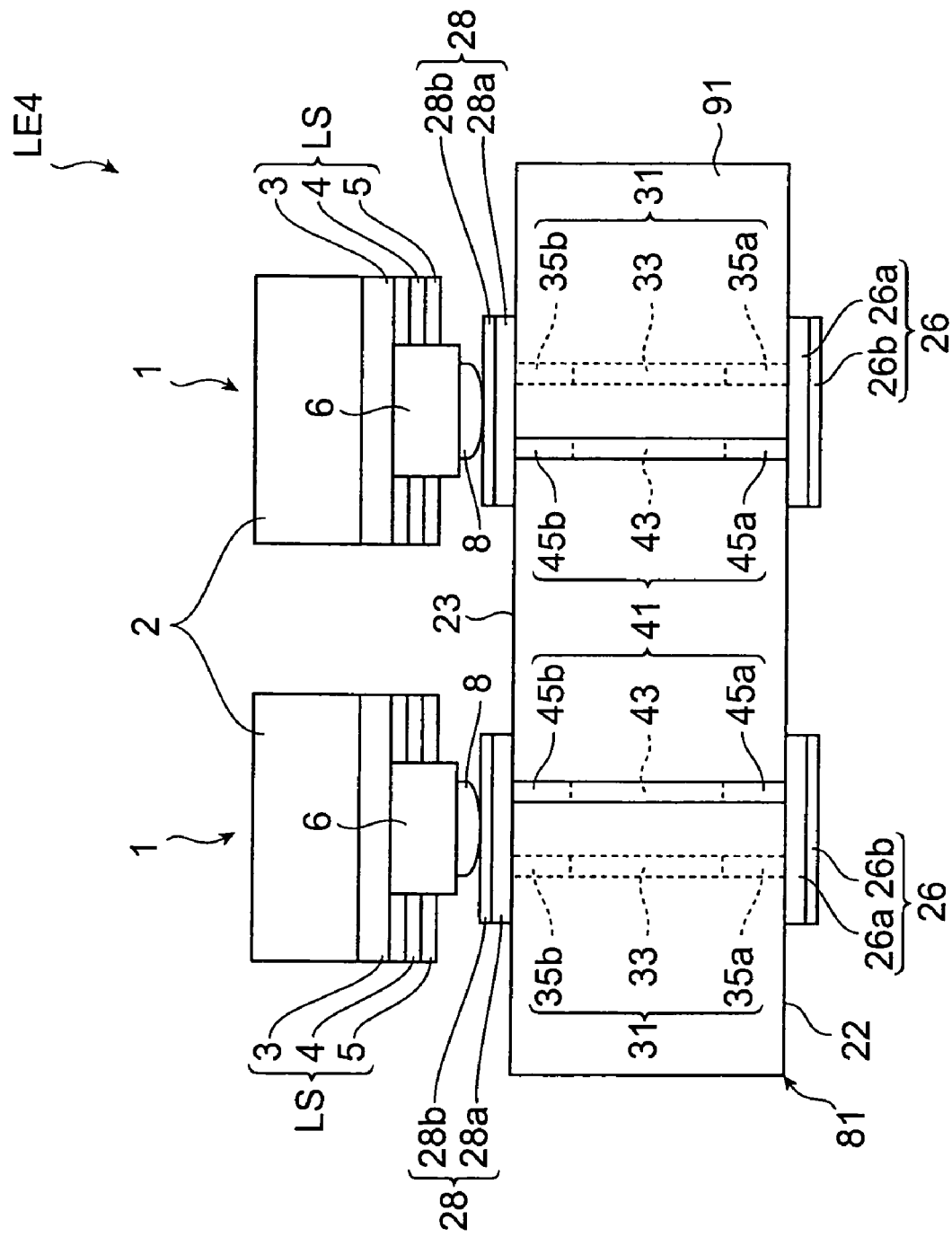
FIG. 15 is a view for explaining a sectional configuration along line XV-XV in FIG. 10.

FIG. 11 is a schematic bottom view showing the light emitting device according to the fourth embodiment. FIG. 12 is a view for explaining a sectional configuration along line XII-XII in FIG. 10. FIG. 13 is a view for explaining a sectional configuration along line XIII-XIII in FIG. 10. FIG. 14 is a view for explaining a sectional configuration along line XIV-XIV in FIG. 10. FIG. 15 is a view for explaining a sectional configuration along line XV-XV in FIG. 10.

The light emitting device LE4, as shown in FIGS. 10 to 13, comprises a plurality of (four in the present embodiment) semiconductor light emitting elements 1, and a multilayer chip varistor 81. Each semiconductor light emitting element 1 is disposed on the multilayer chip varistor 81.

First, the configuration of multilayer chip varistor 81 will be described. The multilayer chip varistor 81, as shown in FIGS. 10 to 14, comprises a varistor element body 91 of an approximately rectangular plate shape, a plurality of (eight in the present embodiment) first external electrodes 25, 26, and a plurality of (eight in the present embodiment) second external electrodes 27, 28. Each first external electrode 25, 26 is disposed on a first principal surface (outer surface) 22 of the varistor element body 91. Each second external electrode 27, 28 is disposed on a second principal surface (outer surface) 23 of the varistor element body 91. The varistor element body 91 is set, for example, to the vertical length of about 2.0 mm, the horizontal length of about 1.0 mm, and the thickness of about 0.3 mm. The first external electrodes 25 function as input terminal electrodes of the multilayer chip varistor 81, and the first external electrodes 26 as output terminal electrodes of the multilayer chip varistor 81. The second external electrodes 27, 28 function as pad electrodes electrically connected to after-described semiconductor light emitting elements 1.

The varistor element body 91 is constructed as a multilayer body in which a plurality of varistor layers to exhibit the varistor characteristics, and a plurality of first internal electrode layers 30 and second internal electrode layers 40 are laminated. When a first internal electrode layer 30 and a second internal electrode layer 40 one each are defined as one internal electrode group, a plurality of (two in the present embodiment) such internal electrode groups are arranged along the laminate direction of the varistor layers in the varistor element body 91. In each internal electrode group, the first internal electrode layer 30 and the second internal electrode layer 40 are alternately arranged so that at least one varistor layer is interposed between the first internal electrode layer 30 and the second internal electrode layer 40. The internal electrode groups are arranged so that at least one varistor layer is interposed between them. In practical multilayer chip varistor 81, the plurality of varistor layers are integrally formed so that no boundary can be visually recognized between them.

The varistor layers contain ZnO as a principal component and also contain as accessory components single metals, such as rare-earth elements, Co, IIIb elements (B, Al, Ga, In), Si, Cr, Mo, alkali metal elements (K, Rb, Cs), and alkaline earth metals (Mg, Ca, Sr, Ba), or oxides of those. In the present embodiment, the varistor layers contain Pr, Co, Cr, Ca, Si, K, Al, etc as accessory components. In this configuration, a region of each varistor layer overlapping with the first internal electrode layer 30 and with the second internal electrode layer 40 contains ZnO as a principal component and also contains Pr.

In the present embodiment, Pr is used as a rare-earth metal. Pr is a material for letting the varistor layers exhibit the varistor characteristics. The reason why Pr is used is that it has excellent nonlinear voltage-current characteristics and little characteristic variation in volume production. There are no particular restrictions on the content of ZnO in the varistor layers, but the content is normally 99.8-69.0% by mass, based on 100% by mass of all the materials making the varistor layers. The thickness of the varistor layers is, for example, about 5-60 µm.

Each first internal electrode layer 30, as shown in FIG. 12, includes a plurality of (two in the present embodiment) first internal electrodes 31. Each first internal electrode 31 is located at a position with a predetermined space from the side faces parallel to the laminate direction in the varistor element body 91. The first internal electrodes 31 have such a predetermined space as to be electrically isolated from each other.

Each first internal electrode 31 includes a first electrode portion 33, and second electrode portions 35a, 35b. The first electrode portion 33, when viewed from the laminate direction, overlaps with a first electrode portion 43 of after-described second internal electrode 41. The first electrode portion 33 is of an approximately rectangular shape. The second electrode portion 35a, as shown in FIG. 14, is led from the first electrode portion 33 so as to be exposed in the first principal surface 22, and functions as a lead conductor. The second electrode portion 35a is physically and electrically connected to the first external electrode 25.

The second electrode portion 35b, as shown in FIG. 14, is led from the first electrode portion 33 so as to be exposed in the second principal surface 23, and functions as a lead conductor. The second electrode portion 35b is physically and electrically connected to the second external electrode 27. The first electrode portion 33 is electrically connected through the second electrode portion 35a to the first external electrode 25 and electrically connected through the second electrode portion 35b to the second external electrode 27. The second electrode portions 35a, 35b are integrally formed with the first electrode portion 33.

Figure 16:
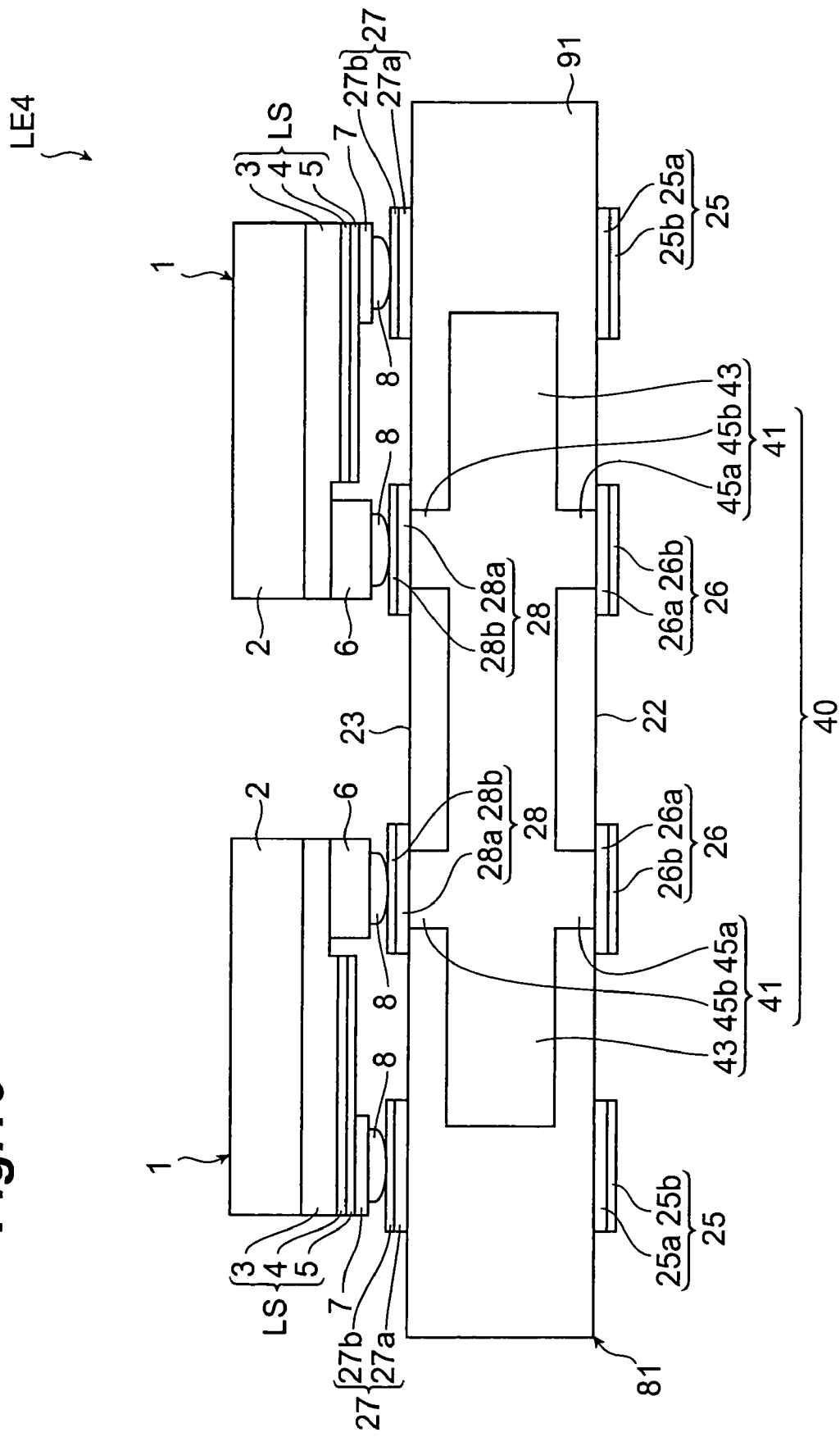
FIG. 16 is a view showing a modification example of second internal electrodes.

Each second internal electrode layer 40, as also shown in FIG. 13, includes a plurality of (two in the present embodiment) second internal electrodes 41. Each second internal electrode 41 is located at a position with a predetermined space from the side faces parallel to the laminate direction in the varistor element body 91. The second internal electrodes 41 have such a predetermined space as to be electrically isolated from each other. The second internal electrodes 41 may be integrally formed so as to constitute one internal electrode, as shown in FIG. 16. In this case, an external electrode 26 may be provided per internal electrode as described above.

Each second internal electrode 41 includes a first electrode portion 43, and second electrode portions 45a, 45b. The first electrode portion 43, when viewed from the laminate direction, overlaps with the first electrode portion 33 of the first internal electrode 31. The first electrode portion 43 is of an approximately rectangular shape. The second electrode portion 45a, as shown in FIG. 15, is led from the first electrode portion 43 so as to be exposed in the first principal surface 22, and functions as a lead conductor. The second electrode portion 45a is physically and electrically connected to the first external electrode 26.

The second electrode portion 45b, as shown in FIG. 15, is led from the first electrode portion 43 so as to be exposed in the second principal surface 23, and functions as a lead conductor. The second electrode portion 45b is physically and electrically connected to the second external electrode 28. The first electrode portion 43 is electrically connected through the second electrode portion 45a to the first external electrode 26 and electrically connected through the second electrode portion 45b to the second external electrode 28. The second electrode portions 45a, 45b are integrally formed with the first electrode portion 43.

The first external electrodes 25, 26 are two-dimensionally arrayed in a matrix of M rows and N columns (where each of parameters M and N is an integer of not less than 2) on the first principal surface 22. In the present embodiment the first external electrodes 25, 26 are two-dimensionally arrayed in a matrix of four rows and two columns. The first external electrodes 25 and the first external electrodes 26 are arranged with a predetermined space in the direction normal to the laminate direction of the varistor layers and parallel to the first principal surface 22, on the first principal surface 22. The first external electrodes 25, 26 are of a rectangular shape (square shape in the present embodiment). The first external electrodes 25, 26 are set, for example, to the length of about 300 μm on each side and the thickness of about 5 μm.

The second external electrodes 27, 28 are two-dimensionally arrayed in a matrix of M rows and N columns (where each of parameters M and N is an integer of not less than 2) on the second principal surface 23. In the present embodiment the second external electrodes 27, 28 are two-dimensionally arrayed in a matrix of four rows and two columns. The second external electrodes 27 and the second external electrodes 28 are arranged with a predetermined space in the direction normal to the laminate direction of the varistor layers and parallel to the second principal surface 23, on the second principal surface 23. The second external electrodes 27, 28 are of a rectangular shape (square shape in the present embodiment). The second external electrodes 27, 28 are set, for example, to the length of about 300 μm on each side and the thickness of about 5 μm.

Each external electrode 25-28 has a first electrode layer 25a-28a and a second electrode layer 25b-28b. The first electrode layers 25a-28a are disposed on the outer surfaces (first principal surface 22 or second principal surface 23) of the varistor element body 91 and contain Pd. The first electrode layers 25a-28a are formed by firing an electroconductive paste, as in the first embodiment.

The second electrode layers 25b-28b are arranged on the first electrode layers 25a-28a. The second electrode layers 25b-28b are formed by printing or by plating, as in the first embodiment. The second electrode layers 25b-28b are made of Au or Pt.

The first electrode portion 33 of the first internal electrode 31 and the first electrode portion 43 of the second internal electrode 41 overlap with each other between the first internal electrode 31 and second internal electrode 41 adjacent to each other, as described above. Therefore, a region overlapping in each varistor layer with the first electrode portion 33 and with the first electrode portion 43 functions as a region to exhibit the varistor characteristics. In the multilayer chip varistor 81 having the above-described configuration, each varistor portion is composed of the first electrode portion 33, the first electrode portion 43, and the region of the varistor layer overlapping with the first electrode portion 33 and with the first electrode portion 43.

A plurality of (two in the present embodiment) varistor portions, each of which is composed of the first electrode portions 33, 43 and the region of the varistor layer overlapping with the first electrode portions 33, 43, are arranged along the laminate direction of the varistor layers. A plurality of (two in the present embodiment) varistor portions, each of which is composed of the first electrode portions 33, 43 and the region of the varistor layer overlapping with the first electrode portions 33, 43, are arranged along the direction parallel to the varistor layers.

The pair of principal surfaces 22, 23 of the varistor element body 91 face each other. The pair of principal surfaces 22, 23 extend in directions parallel to the directions in which the aforementioned varistor portions are arranged. Namely, the pair of principal surfaces 22, 23 extend in the direction parallel to the laminate direction of the varistor layers, while the pair of principal surfaces 22, 23 extend in parallel with the direction parallel to the varistor layers. The varistor element body 91 is of a plate shape having the pair of principal surfaces 22, 23 as described above. The distance between the pair of principal surfaces 22, 23 is smaller than the lengths in the directions in which the varistor portions are arranged in the varistor element body 21, i.e., the laminate direction of the varistor layers and the direction parallel to the varistor layers. The distance between the pair of principal surfaces 22, 23 is equivalent to the thickness of the varistor element body 91.

Figure 17:
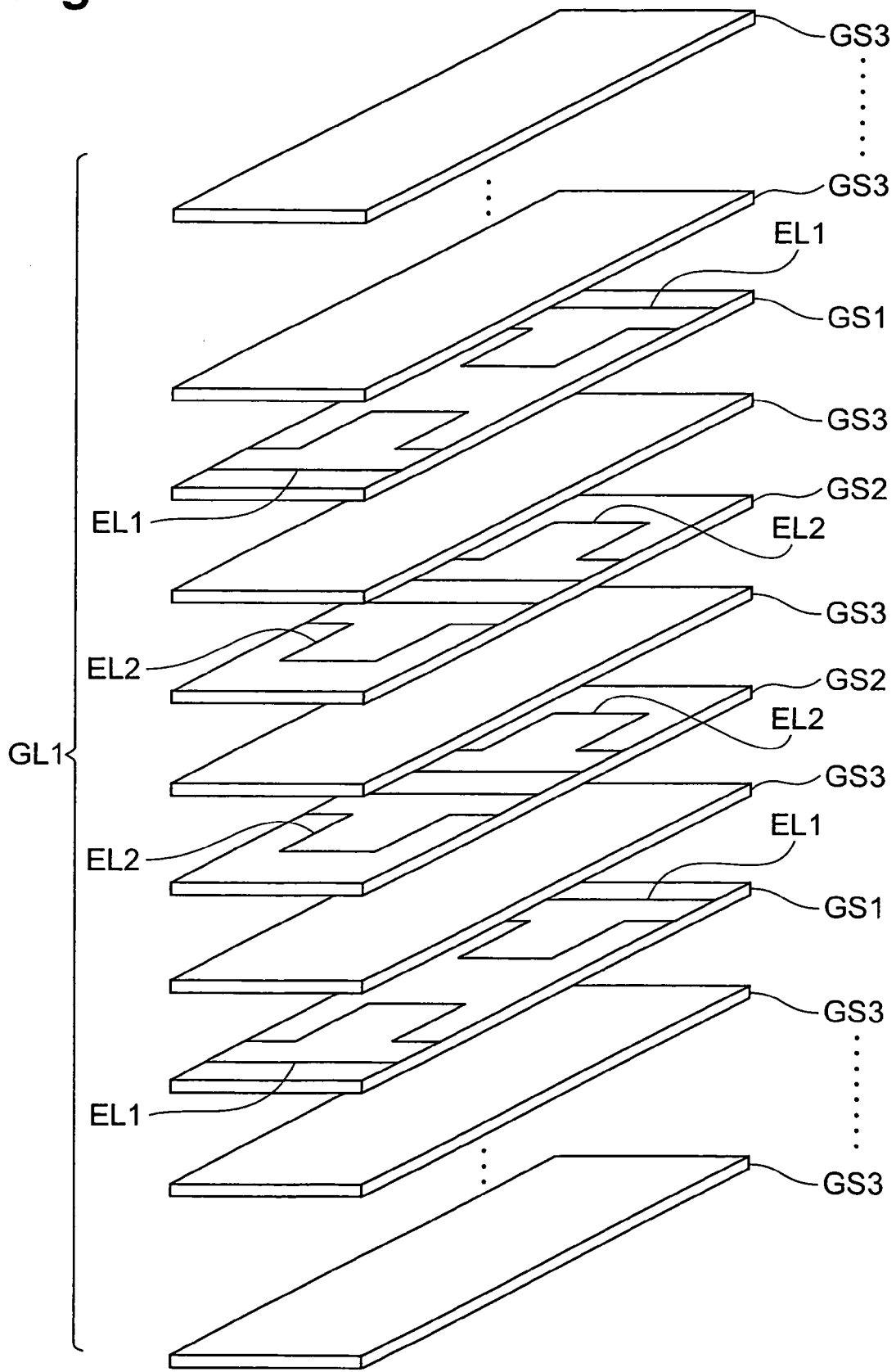
FIG. 17 is an illustration for explaining a production process of a multilayer chip varistor according to the fourth embodiment.

Subsequently, a production process of multilayer chip varistor 81 having the above-described configuration will be described with reference to FIGS. 5 and 17. FIG. 17 is an illustration for explaining the production process of the multilayer chip varistor according to the fourth embodiment. The production process of multilayer chip varistor 81 is much the same as the production process of the multilayer chip varistor 11 described above, and thus the description will be simplified.

First, a varistor material is prepared (step S101), an organic binder, an organic solvent, an organic plasticizer, etc. are added into this varistor material, and they are mixed and pulverized for about 20 hours by means of a ball mill or the like to obtain a slurry. Then green sheets are made from this slurry (step S103).

Next, a plurality of electrode portions corresponding to the first internal electrodes 31 are formed (in a number corresponding to the number of divided chips described later) on green sheets (step S105). Similarly, a plurality of electrode portions corresponding to the second internal electrodes 41 are formed (in a number corresponding to the number of divided chips described later) on other green sheets (step S105).

Next, the green sheets with the electrode portions, and green sheets without electrode portions are laminated in a predetermined order to form a sheet laminated body (step S107). The sheet laminated body obtained in this manner is cut in chip units to obtain a plurality of divided green bodies GL1 (cf. FIG. 17) (step S109).

Next, an electroconductive paste for the first electrode layers 25a-28a and an electroconductive paste for the second electrode layers 25b-28b are applied onto outer surfaces of each green body GL1 (step S111).

Then the green body GL1 with the electroconductive pastes is subjected to a heat treatment at 180-400° C. and for about 0.5-24 hours to effect debinder, and thereafter is further fired at 1000-1400° C. for about 0.5-8 hours (step S113) to obtain the varistor element body 91, the first electrode layers 25a-28a, and the second electrode layers 25b-28b.

The above process completes the multilayer chip varistor 81. An alkali metal (e.g., Li, Na, or the like) may be diffused from a surface of the varistor element body 91 after the firing.

Each semiconductor light emitting element 1, as shown in FIGS. 12 to 15, is bump-connected to a corresponding pair of second external electrodes 27, 28. In this configuration, the varistor portions, each of which is composed of the first electrode portions 33, 43 and the region of the varistor layer overlapping with the first electrode portions 33, 43, are connected in parallel to the semiconductor light emitting elements 1.

In the fourth embodiment, as described above, each varistor portion is connected in parallel to the semiconductor light emitting element 1 corresponding thereto, so that each semiconductor light emitting element 1 can be protected from the ESD surge.

In the fourth embodiment, the varistor element body 91 includes the plurality of varistor portions, and the plurality of first external electrodes 25, 26 are disposed on the first principal surface 22. Each of the plurality of first external electrodes 25, 26 is electrically connected through the second electrode portion 35a, 45a to the corresponding internal electrode 31, 41. Therefore, the light emitting device LE4 (multilayer chip varistor 81) is mounted so that the first principal surface 22 faces a mounting surface of an external substrate, an external device, or the like, whereby the plurality of varistor portions are mounted on the external substrate, the external device, or the like. In consequence, the mounting area can be reduced on the occasion of mounting the plurality of varistor portions. It is also feasible to implement easy mounting, while reducing the mounting cost for mounting the plurality of varistor portions.

Incidentally, in the multilayer chip varistor 81 of the fourth embodiment, the first external electrodes 25 functioning as the input terminal electrodes and the first external electrodes 26 functioning as the output terminal electrodes are arranged both on the first principal surface 22 of the varistor element body 91. Namely, the multilayer chip varistor 81 is a multilayer chip varistor arranged as a BGA (Ball Grid Array) package. The multilayer chip varistor 81 is mounted on an external substrate, an external device, or the like by electrically and mechanically connecting the external electrodes 25, 26 to respective lands corresponding thereto by means of solder balls, bump electrodes, or the like.

In the fourth embodiment the plurality of second external electrodes 27, 28 are disposed on the second principal surface 23. Each of the plurality of second external electrodes 27, 28 is electrically connected through the second electrode portion 35b, 45b to the corresponding internal electrode 31, 41. As a result, the plurality of semiconductor light emitting elements 1 can be readily mounted so as to be connected in parallel to the varistor portions, by making use of the second principal surface 23.

In the fourth embodiment, as in the first embodiment, the heat generated in the semiconductor light emitting elements 1 is transferred mainly to the second external electrodes 27, 28 and the first and second internal electrodes 31, 41 to radiate. This expands the heat radiation paths for the heat generated in the semiconductor light emitting elements 1, so that the heat generated in the semiconductor light emitting elements 1 can be efficiently diffused.

In the fourth embodiment, as in the first embodiment, the heat radiation paths from each internal electrode 31, 41 to the first principal surface 22 and the second principal surface 23 of the varistor element body 91, i.e., the heat radiation paths to the outer surfaces of the multilayer chip varistor 81 are short. This enables more efficient diffusion of the heat from the first and second internal electrodes 31, 41.

In the fourth embodiment, as in the first embodiment, an improvement is made in the bonding strength between the varistor element body 91 and the first and second external electrodes 25-28 (first electrode layers 25a-28a) as described above.

In the fourth embodiment the varistor element body 91 is of the approximate plate shape having the pair of principal surfaces 22, 23, and the distance between the pair of principal surfaces 22, 23 is smaller than the lengths in the directions in which the varistor portions are arranged in the varistor element body 91. This permits the multilayer chip varistor 81 to be constructed in a low profile and also permits the light emitting device LE4 to be constructed in a low profile.

In the fourth embodiment, as in the first embodiment, each semiconductor light emitting element 1 is bump-connected to the corresponding second external electrodes 27, 28 to be disposed on the multilayer chip varistor 81. As a result, it is feasible to achieve extremely easy and simple mounting of each semiconductor light emitting element 1 onto the multilayer chip varistor 81.

In the multilayer chip varistors 11, 51, 71, 81 of the first to fourth embodiments, the varistor element body 21, 53, 91 (varistor layers) does not contain Bi. The reason why the varistor element body 21, 53, 91 does not contain Bi is as follows. If the varistor element body contains ZnO as a principal component and also contains Bi and if each external electrode has an electrode layer formed on the outer surface of the varistor element body by simultaneous firing with the varistor element body and containing Pd, the simultaneous firing of the electrode layer with the varistor element body will result in alloying Bi and Pd to form an alloy of Bi and Pd at the interface between the varistor element body and the electrode layer. The alloy of Bi and Pd has poor wettability, particularly, to the varistor element body and acts to lower the bonding strength between the varistor element body and the electrode layer. For this reason, it becomes difficult to secure the bonding strength in a desired state between the varistor element body and the electrode layer.

The above described the preferred embodiments of the present invention, but it is noted that the present invention is by no means limited to these embodiments.

The multilayer chip varistor 11 of the first embodiment has a pair of internal electrodes 31, 41, but the present invention is not limited to this. For example, the multilayer chip varistor may have a plurality of first internal electrodes 31 and a plurality of second internal electrodes 41 as the multilayer chip varistors 51, 71 of the second and third embodiments do.

The number of semiconductor light emitting elements 1 disposed on the multilayer chip varistor 81 of the fourth embodiment is not limited to the aforementioned number 4, but may be two or more. In this case, the number of varistor portions and external electrodes 25-28 is set to a number corresponding to the number of semiconductor light emitting elements 1.

Each varistor portion of the multilayer chip varistor 81 has a pair of internal electrodes 31, 41, but the present invention is not limited to this. Each varistor portion may have a plurality of first internal electrodes 31 and a plurality of second internal electrodes 41.

In the multilayer chip varistor 81 a plurality of varistor portions are arranged along the laminate direction of the varistor layers and along the direction parallel to the varistor layers, but the present invention is not limited to this. A plurality of varistor portions may be arranged only along the laminate direction of the varistor layers. Furthermore, a plurality of varistor portions may also be arranged only along the direction parallel to the varistor layers. The number of varistor portions arranged is not limited to the aforementioned numbers, either.

The first to fourth embodiments adopt the GaN semiconductor LED as each semiconductor light emitting element 1, but the present invention is not limited to this. The semiconductor light emitting element 1 may be any nitride semiconductor LED (e.g., an InGaNAs semiconductor LED or the like) other than the GaN nitride semiconductor LED, any compound semiconductor LED other than the nitride type, or a laser diode (LD).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light emitting device comprising:
a semiconductor light emitting element; and
a multilayer chip varistor,
wherein the multilayer chip varistor has:
a multilayer body with a varistor portion therein, the varistor portion comprising a varistor layer comprising ZnO as a principal component and exhibiting nonlinear voltage-current characteristics, and a plurality of internal electrodes disposed so as to interpose the varistor layer between the internal electrodes; and
a plurality of external electrodes disposed on an outer surface of the multilayer body and connected to respective corresponding internal electrodes out of the plurality of internal electrodes,
wherein the semiconductor light emitting element is arranged on the multilayer chip varistor and connected to corresponding external electrodes out of the plurality of external electrodes so as to be connected in parallel to the varistor portion, and
wherein the semiconductor light emitting element is arranged to face a surface extending in a direction parallel to a laminate direction of the multilayer body in the multilayer chip varistor.

2. The light emitting device according to claim 1,
wherein the plurality of external electrodes includes a pair of terminal electrodes, and
wherein each of the pair of terminal electrodes comprises:
a first electrode portion disposed on one outer surface extending in a direction parallel to a laminate direction of the multilayer body and selected from a pair of outer surfaces facing each other; and
a second electrode portion disposed on one outer surface being adjacent to the pair of outer surfaces and extending in the direction parallel to the laminate direction of the multilayer body.

3. The light emitting device according to claim 1,
wherein the varistor layer comprises Pr, and
wherein each of the plurality of external electrodes has an electrode layer which is formed on the outer surface of the multilayer body by simultaneous firing with the multilayer body and which comprises Pd.

4. The light emitting device according to claim 1,
wherein the varistor layer comprises Pr,
wherein each of the plurality of external electrodes has an electrode layer disposed on the outer surface of the multilayer body and comprising Pd, and
wherein an oxide of Pr in the varistor layer and Pd in the electrode layer exists near an interface between the multilayer body and the electrode layer.

5. The light emitting device according to claim 4, wherein the electrode layer is formed on the outer surface of the multilayer body by simultaneous firing with the multilayer body.

6. The light emitting device according to claim 1,
wherein the plurality of external electrodes comprises:
a pair of first external electrodes disposed on a first outer surface of the multilayer body; and
a pair of second external electrodes disposed on a second outer surface of the multilayer body facing the first outer surface,
wherein the plurality of internal electrodes comprises:
first electrode portions overlapping with each other between adjacent internal electrodes out of the plurality of internal electrodes; and
second electrode portions led from the first electrode portions so as to be exposed in the first outer surface and in the second outer surface, and
wherein each of the pair of first external electrodes and the pair of second external electrodes is electrically connected through the second electrode portion to the corresponding internal electrode out of the plurality of internal electrodes.

7. The light emitting device according to claim 6, wherein the first outer surface and the second outer surface extend in a direction parallel to a laminate direction of the multilayer body.

8. The light emitting device according to claim 6, wherein the semiconductor light emitting element is disposed on the multilayer chip varistor by being bump-connected to the pair of second external electrodes.

9. The light emitting device according to claim 1, wherein the semiconductor light emitting element has a semiconductor region of a first conductivity type and a semiconductor region of a second conductivity type, and emits light according to a voltage applied between the semiconductor region of the first conductivity type and the semiconductor region of the second conductivity type.

10. The light emitting device according to claim 1, further comprising:
a plurality of the semiconductor light emitting elements,
wherein the multilayer body comprises a plurality of the varistor portions arranged along a predetermined direction,
wherein the plurality of external electrodes comprises:
a plurality of first external electrodes disposed on a first outer surface of the multilayer body; and
a plurality of second external electrodes disposed on a second outer surface of the multilayer body facing the first outer surface,
wherein the first outer surface extends in a direction parallel to the predetermined direction,
wherein the plurality of internal electrodes which the plurality of varistor portions have, comprises:
first electrode portions overlapping with each other between adjacent internal electrodes out of the plurality of internal electrodes; and
second electrode portions led from the first electrode portions so as to be exposed in the first and second outer surfaces,
wherein each of the plurality of first external electrodes and the plurality of second external electrodes is electrically connected through the second electrode portion to the first electrode portion of a corresponding internal electrode out of the plurality of internal electrodes; and
wherein the plurality of semiconductor light emitting elements is arranged on the multilayer chip varistor and each of the semiconductor light emitting elements is connected to the corresponding second external electrodes out of the plurality of second external electrodes so as to be connected in parallel to the corresponding varistor portion out of the plurality of varistor portions.

11. The light emitting device according to claim 10, wherein the first outer surface and the second outer surface extend in a direction parallel to a laminate direction of the multilayer body.

12. The light emitting device according to claim 10, wherein the varistor layer comprises Pr, wherein each of the plurality of first external electrodes has an electrode layer formed on the first outer surface by simultaneous firing with the multilayer body, and comprising Pd, and wherein each of the plurality of second external electrodes has an electrode layer formed on the second outer surface by simultaneous firing with the multilayer body, and comprising Pd.

13. The light emitting device according to claim 10,
wherein the varistor layer comprises Pr,
wherein each of the plurality of first external electrodes has an electrode layer disposed on the first outer surface and comprising Pd,
wherein each of the plurality of second external electrodes has an electrode layer disposed on the second outer surface and comprising Pd, and
wherein an oxide of Pr in the varistor layer and Pd in each electrode layer exists near an interface between the multilayer body and the electrode layer.

14. The light emitting device according to claim 13, wherein the electrode layers are formed on the first and second outer surfaces by simultaneous firing with the multilayer body.

15. The light emitting device according to claim 10,
wherein the multilayer body is of an approximate plate shape having the first outer surface and the second outer surface as principal surfaces, and
wherein a distance between the first outer surface and the second outer surface is smaller than a length of the multilayer body in the predetermined direction.

16. The light emitting device according to claim 10, wherein the predetermined direction is a laminate direction of the varistor layers.

17. The light emitting device according to claim 10, wherein the predetermined direction is a direction parallel to the varistor layers.

18. The light emitting device according to claim 10,
wherein the plurality of first external electrodes is two-dimensionally arrayed on the first outer surface, and
wherein the plurality of second external electrodes is two-dimensionally arrayed on the second outer surface.

19. The light emitting device according to claim 10, wherein each the semiconductor light emitting element is arranged on the multilayer chip varistor by being bump-connected to the corresponding second external electrodes.

20. A light emitting device comprising:
a plurality of semiconductor light emitting elements, and
a multilayer chip varistor,
wherein the multilayer chip varistor has a multilayer body in which a plurality of varistor portions is arranged along a predetermined direction, each of the plurality of varistor portions having a varistor layer comprising ZnO as a principal component and exhibiting nonlinear voltage-current characteristics, and a plurality of internal electrodes arranged so as to interpose the varistor layer between the internal electrodes, and
wherein the plurality of semiconductor light emitting elements is arranged on the multilayer chip varistor and each of the semiconductor light emitting elements is connected in parallel to a corresponding varistor portion out of the plurality of varistor portions.

21. A light emitting device comprising:
a plurality of semiconductor light emitting elements; and
a multilayer chip varistor,
wherein the multilayer chip varistor comprises:
a multilayer body in which a plurality of varistor layers comprising ZnO as a principal component and exhibiting nonlinear voltage-current characteristics is laminated,
a plurality of first external electrodes disposed on a first outer surface of the multilayer body; and
a plurality of second external electrodes disposed on a second outer surface of the multilayer body facing the first outer surface,
wherein the first outer surface extends in a direction parallel to a laminate direction of the plurality of varistor layers,
wherein each varistor portion comprises the varistor layer and a plurality of internal electrodes arranged to interpose the varistor layer between the internal electrodes, are arranged along a direction parallel to the first outer surface,
wherein the plurality of internal electrodes comprises:
first electrode portions overlapping with each other between adjacent internal electrodes out of the plurality of internal electrodes; and
second electrode portions led from the first electrode portions so as to be exposed in the first and second outer surfaces,
wherein each of the plurality of first external electrodes and the plurality of second external electrodes is electrically connected through the second electrode portion to the first electrode portion of a corresponding internal electrode out of the plurality of internal electrodes, and
wherein the plurality of semiconductor light emitting elements is arranged on the multilayer chip varistor, and each of the semiconductor light emitting elements is connected to corresponding second external electrodes out of the plurality of second external electrodes so as to be connected in parallel to a corresponding varistor portion out of the plurality of varistor portions.

* * * * *